US012568575B2

(12) United States Patent
Kim et al.

(10) Patent No.: US 12,568,575 B2
(45) Date of Patent: Mar. 3, 2026

(54) CIRCUIT BOARD

(71) Applicant: LG INNOTEK CO., LTD., Seoul (KR)

(72) Inventors: Hae Sik Kim, Seoul (KR); Jee Heum Paik, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 27 days.

(21) Appl. No.: 18/761,093

(22) Filed: Jul. 1, 2024

(65) Prior Publication Data

US 2025/0040042 A1      Jan. 30, 2025

Related U.S. Application Data

(63) Continuation of application No. 17/921,778, filed as application No. PCT/KR2021/005248 on Apr. 26, 2021, now Pat. No. 12,063,737.

(30) Foreign Application Priority Data

Apr. 27, 2020      (KR) ........................ 10-2020-0050684

(51) Int. Cl.
 *H05K 1/02* (2006.01)
 *H04N 23/68* (2023.01)
 *H05K 1/11* (2006.01)

(52) U.S. Cl.
 CPC ......... *H05K 1/0296* (2013.01); *H04N 23/687* (2023.01); *H05K 1/116* (2013.01); *H05K 2201/0939* (2013.01); *H05K 2201/09618* (2013.01); *H05K 2201/10151* (2013.01); *H05K 2201/10287* (2013.01)

(58) Field of Classification Search
 CPC ................ H05K 1/0296; H05K 1/116; H05K 2201/0939; H05K 2201/09618; H05K 2201/10151; H05K 2201/10287; H04N 23/687
 USPC ....................................... 348/208.7
 See application file for complete search history.

(56) References Cited

U.S. PATENT DOCUMENTS

| | | | |
|---|---|---|---|
| 5,958,209 A | 9/1999 | Sakai et al. | |
| 6,194,056 B1 | 2/2001 | Sakai et al. | |
| 7,286,370 B2 | 10/2007 | Ooyabu | |
| 8,409,726 B2 | 4/2013 | Shim et al. | |
| 9,744,743 B2 | 8/2017 | Jung et al. | |
| 10,983,303 B2 | 4/2021 | Jung et al. | |
| 11,089,682 B2 | 8/2021 | Lee et al. | |
| 11,582,388 B2 | 2/2023 | Hubert et al. | |
| 12,028,615 B2 | 7/2024 | Hubert et al. | |
| 2003/0121698 A1 | 7/2003 | Kyougoku et al. | |
| 2005/0272276 A1 | 12/2005 | Ooyabu | |

(Continued)

FOREIGN PATENT DOCUMENTS

| | | |
|---|---|---|
| CN | 108780207 A | 11/2018 |
| CN | 110896591 A | 3/2020 |

(Continued)

*Primary Examiner* — Joel W Fosselman
(74) *Attorney, Agent, or Firm* — Birch, Stewart, Kolasch & Birch, LLP

(57)      ABSTRACT

Discussed is a circuit board including an insulating layer, and a lead pattern part disposed on the insulating layer. The lead pattern part has a centerline average roughness in a range of 0.05 μm to 0.5 μm or a 10-point average roughness in a range of 1.0 μm to 5.0 μm.

20 Claims, 22 Drawing Sheets

(56)                    References Cited

U.S. PATENT DOCUMENTS

| | | |
|---|---|---|
| 2008/0192124 A1 | 8/2008 | Nagasaki |
| 2009/0095515 A1 | 4/2009 | Sakai et al. |
| 2010/0116528 A1 | 5/2010 | Shim et al. |
| 2014/0327790 A1 | 11/2014 | Kim et al. |
| 2018/0171991 A1 | 6/2018 | Miller et al. |
| 2019/0141248 A1 | 5/2019 | Hubert et al. |
| 2024/0305889 A1 | 9/2024 | Hubert et al. |

FOREIGN PATENT DOCUMENTS

| | | | |
|---|---|---|---|
| CN | 210327773 U | | 4/2020 |
| EP | 1 601 053 A1 | | 11/2005 |
| JP | 3-276739 A | | 12/1991 |
| JP | H03276739 | * | 12/1991 |
| JP | 2005-340385 A | | 12/2005 |
| JP | 2008-294150 A | | 12/2008 |
| JP | 2009-215604 A | | 9/2009 |
| JP | 2010-118662 A | | 5/2010 |
| JP | 2019-512734 A | | 5/2019 |
| KR | 10-1999-0028891 A | | 4/1999 |
| KR | 10-2008-0076814 A | | 8/2008 |
| KR | 10-2014-0083836 A | | 7/2014 |
| KR | 10-2017-0135151 A | | 12/2017 |
| KR | 10-2018-0054952 A | | 5/2018 |
| KR | 10-2019-0097113 A | | 8/2019 |
| KR | 10-2020-0106312 A | | 9/2020 |

* cited by examiner

【FIG. 1】
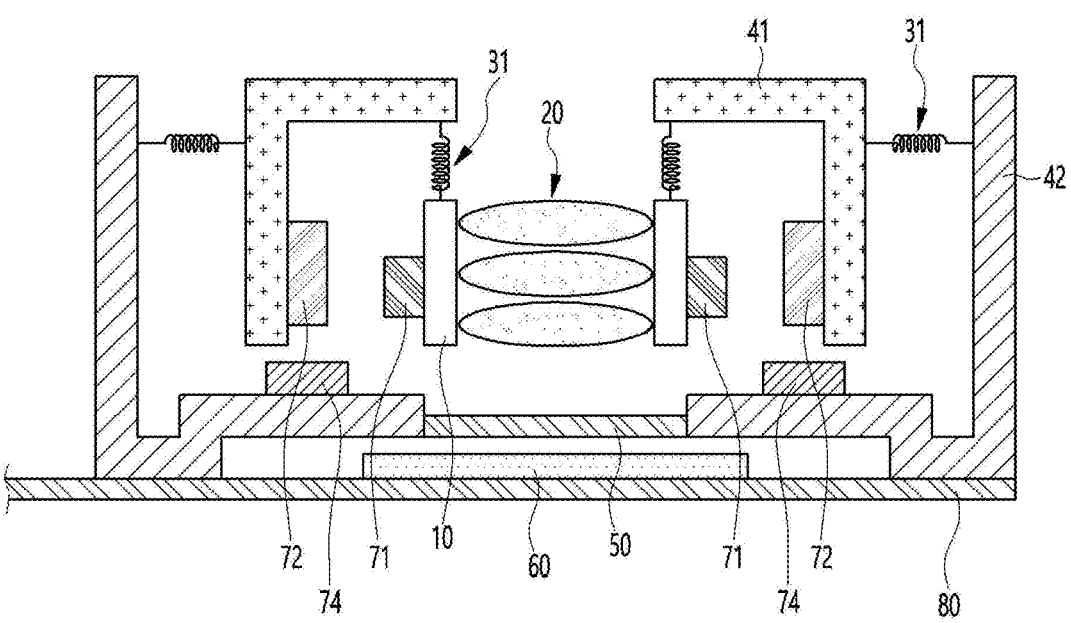
【FIG. 2】
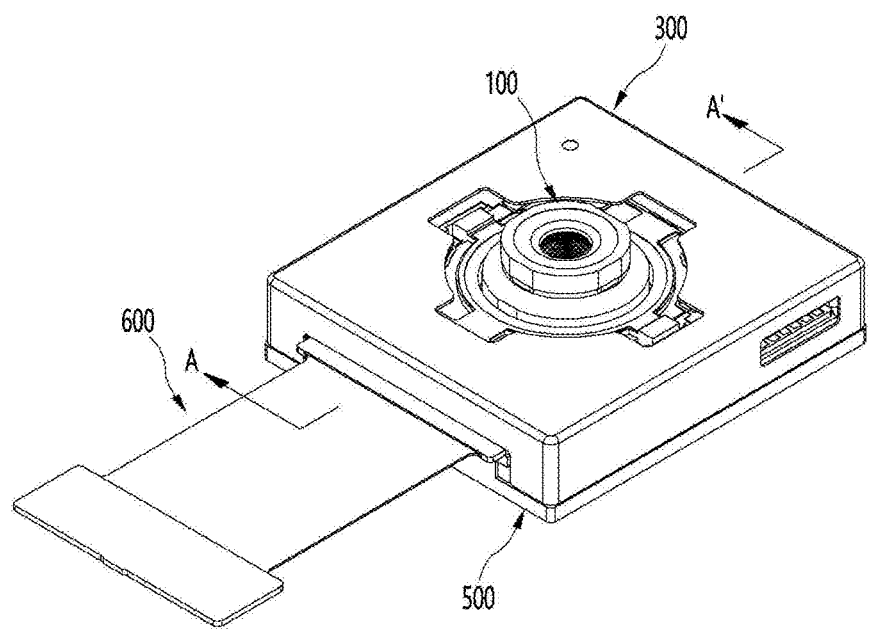

[FIG. 3]
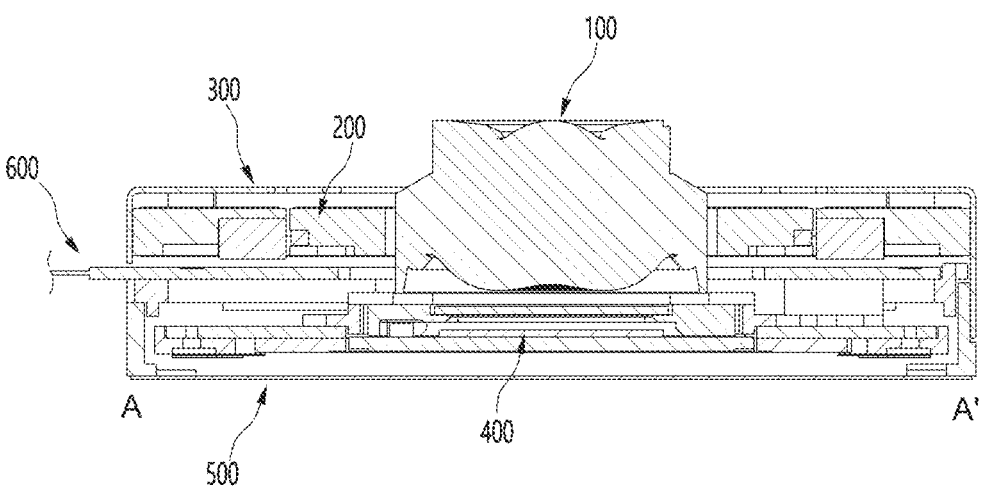

【FIG. 4】
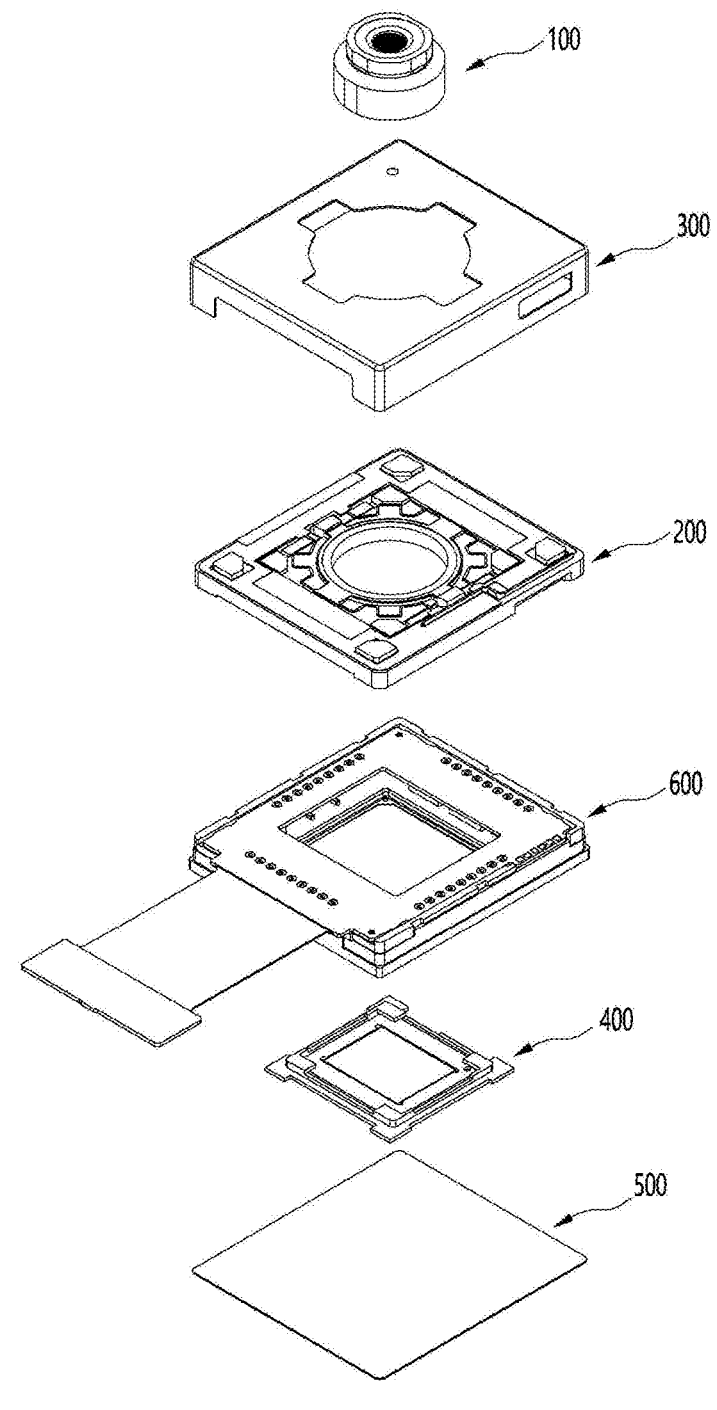

【FIG. 5】
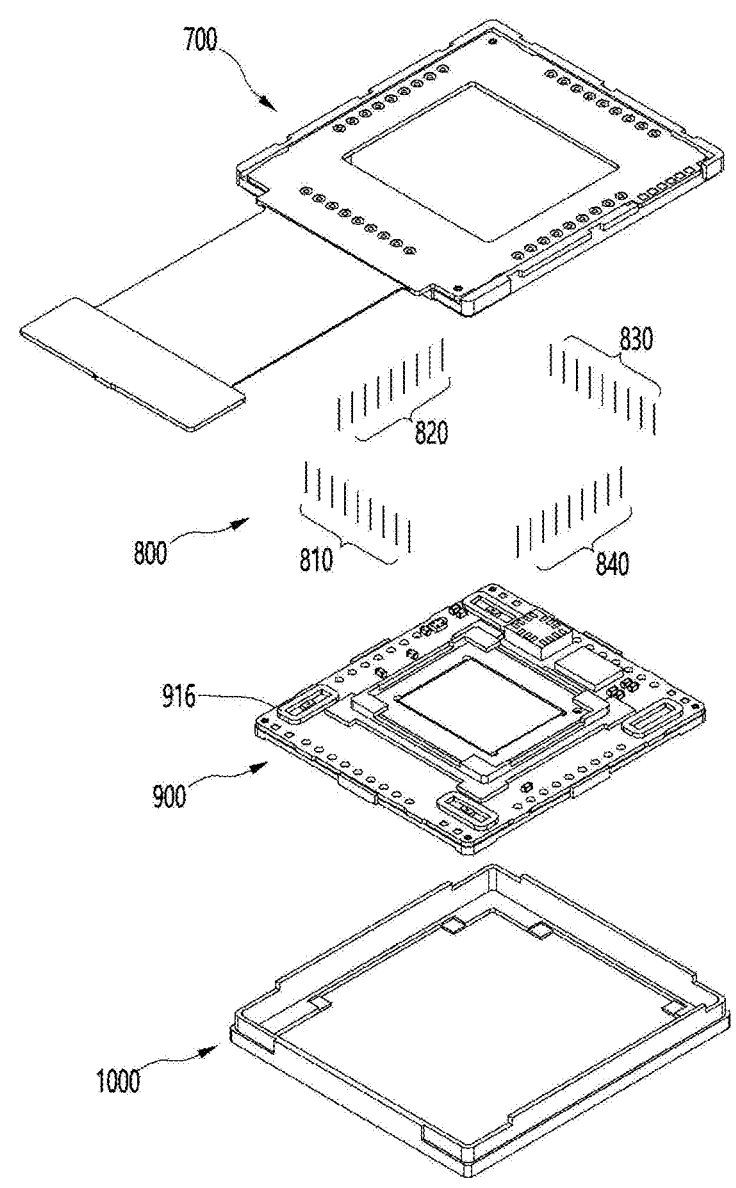

【FIG. 6】
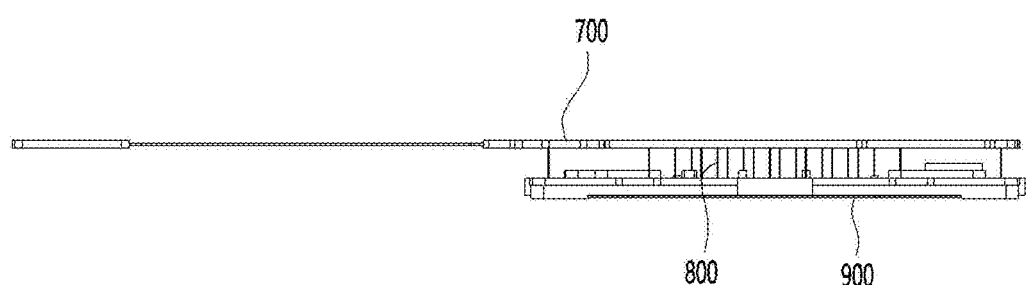

【FIG. 7】
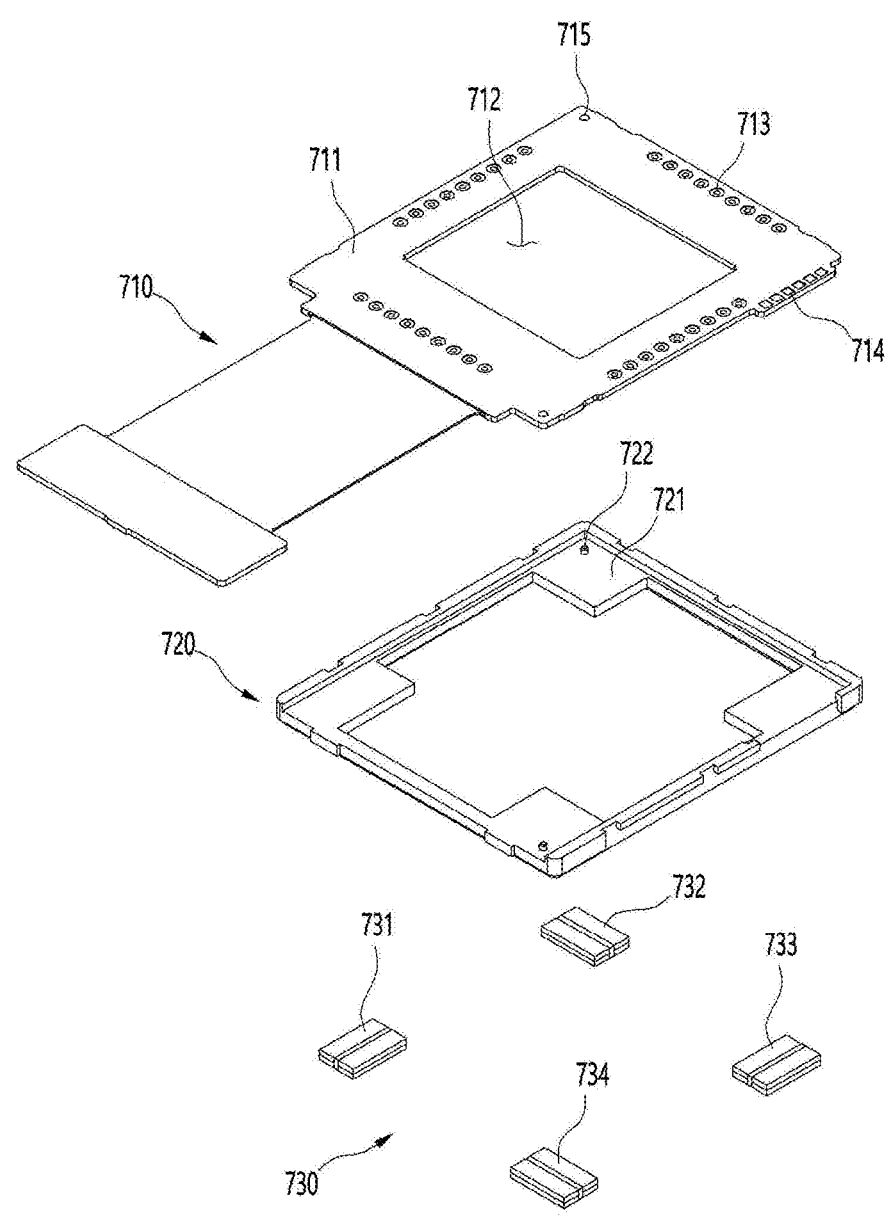

【FIG. 8】
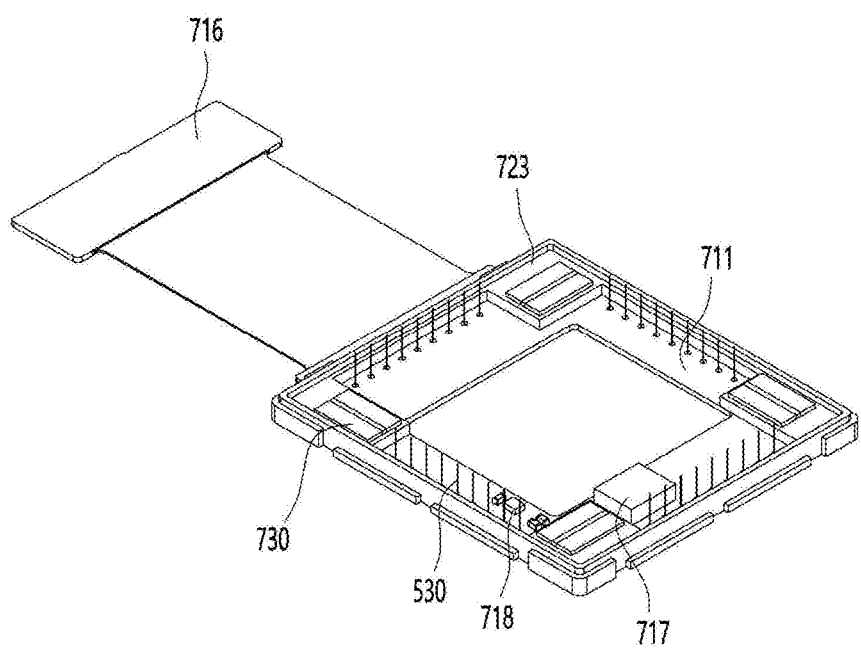
【FIG. 9】
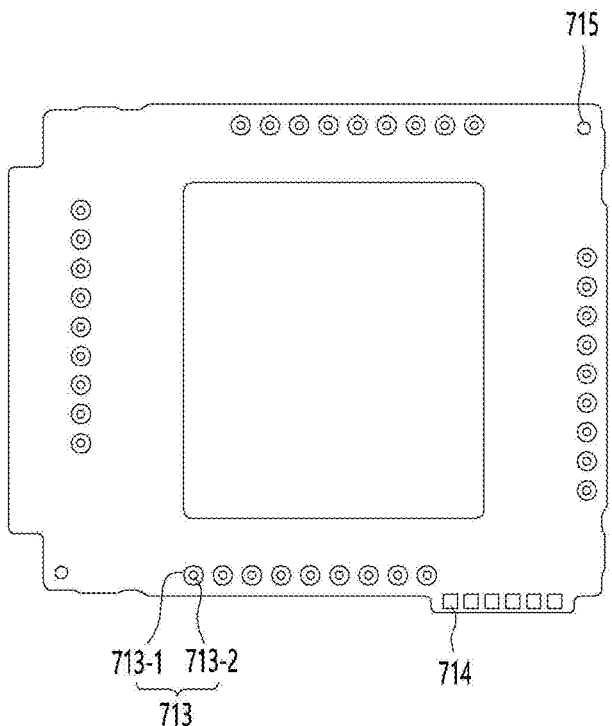

【FIG. 10】
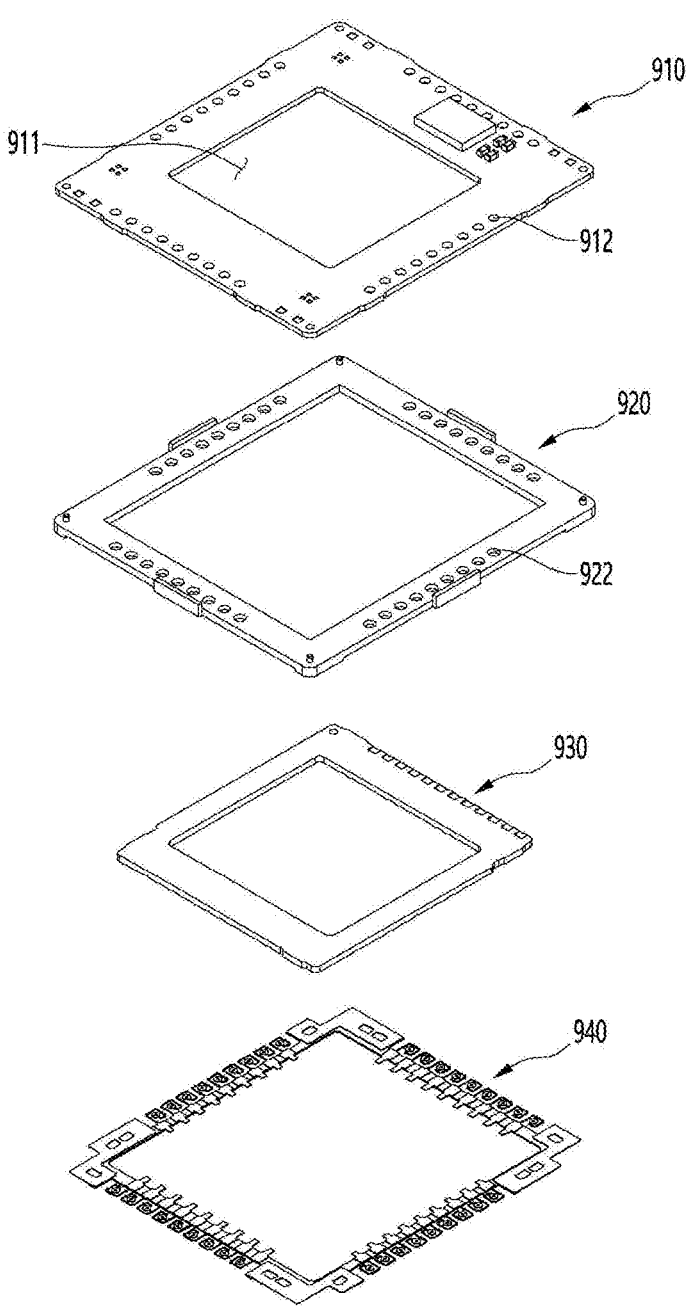

【FIG. 11】
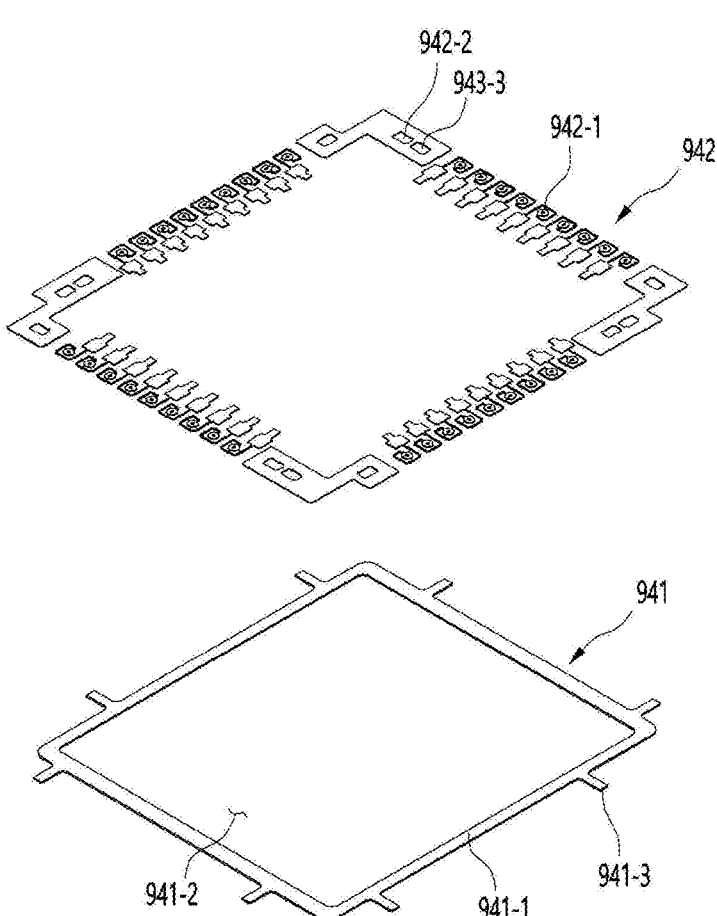

【FIG. 12】
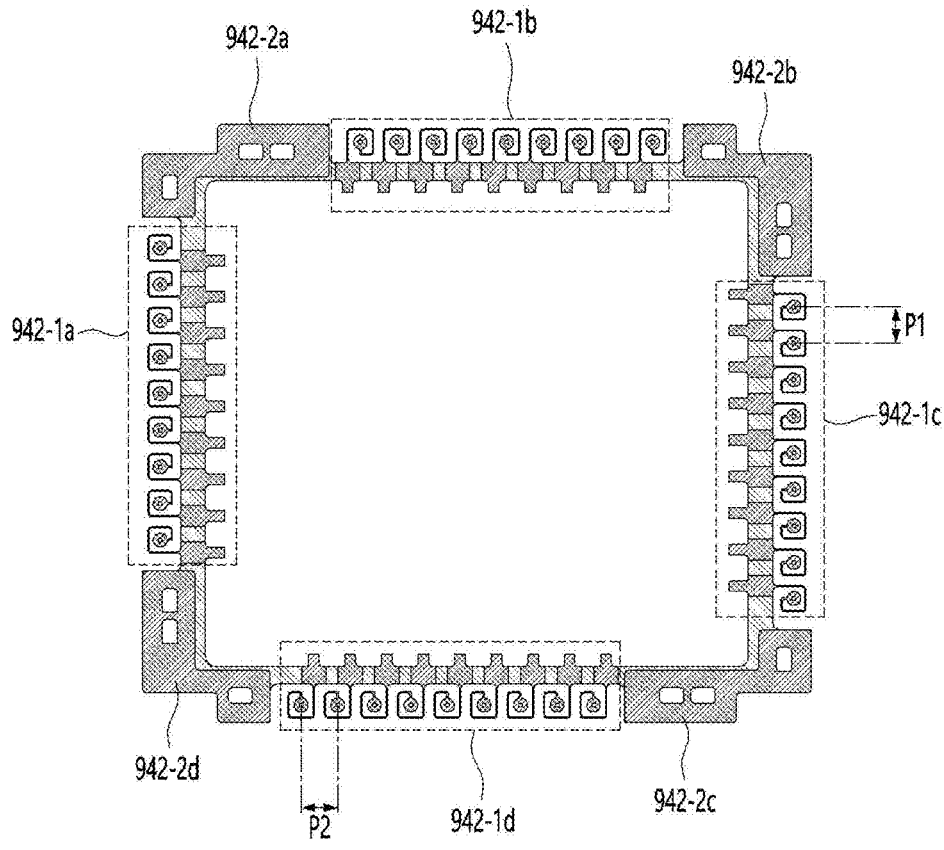
【FIG. 13】
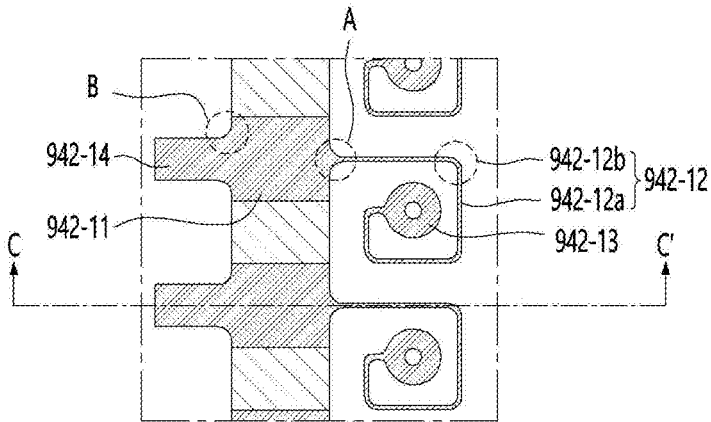

【FIG. 14】
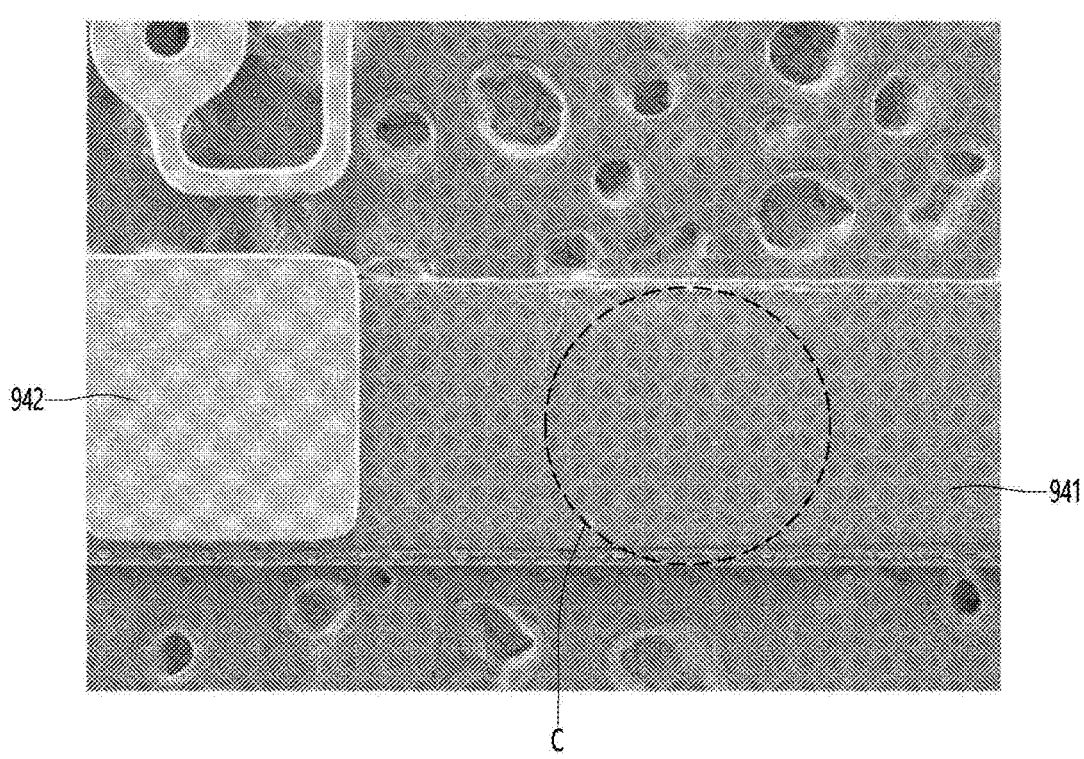

[FIG. 15A]
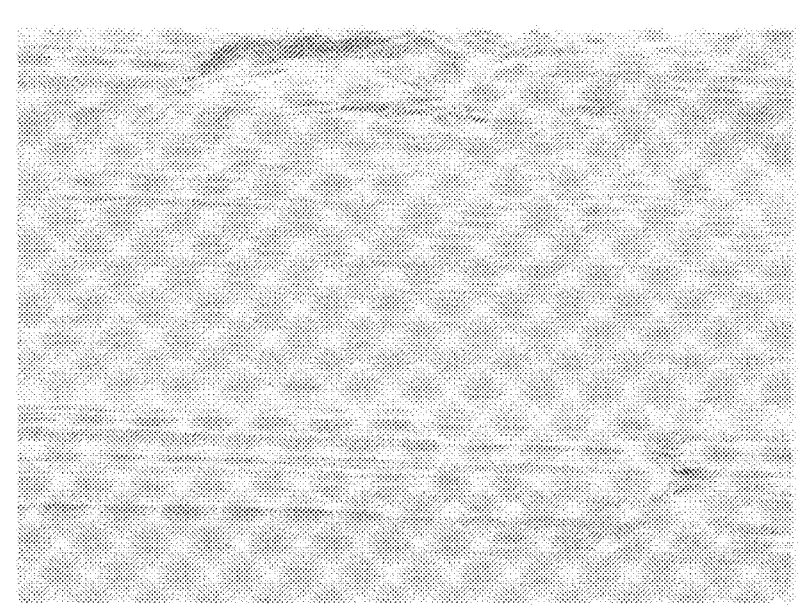
[FIG. 15B]
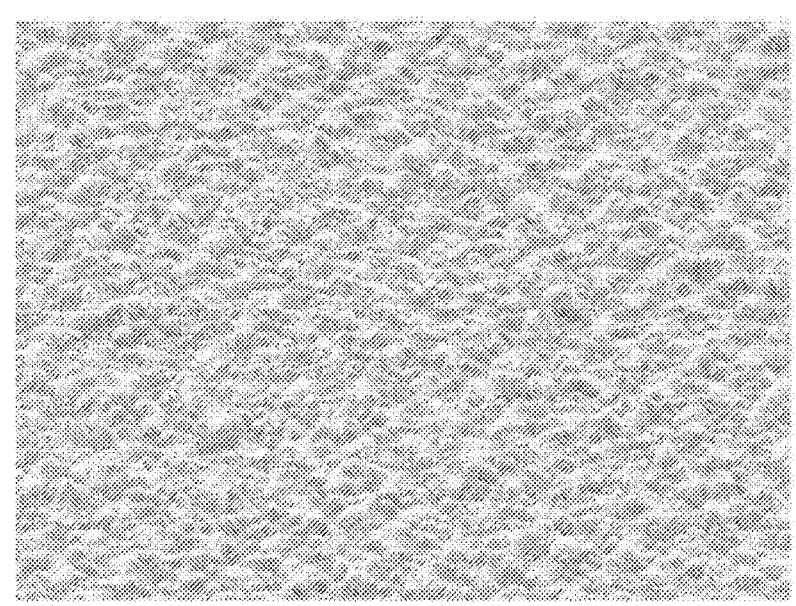

【FIG. 16A】
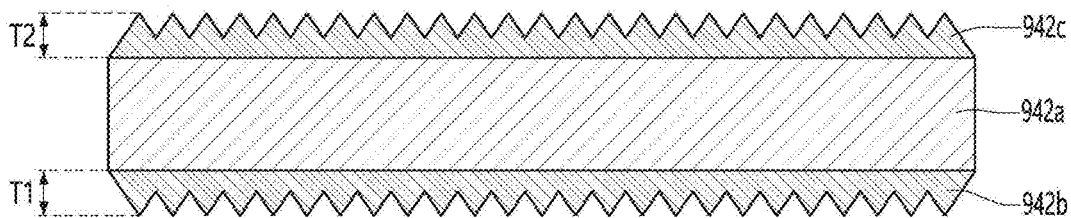
【FIG. 16B】
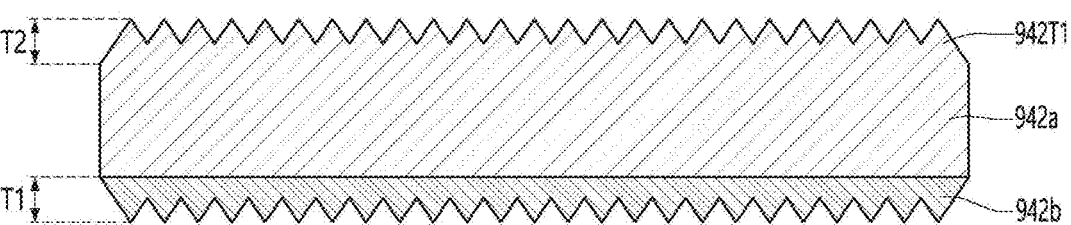
【FIG. 16C】
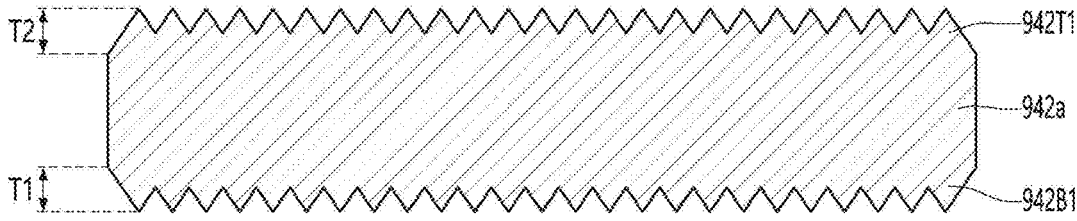

[FIG. 17A]
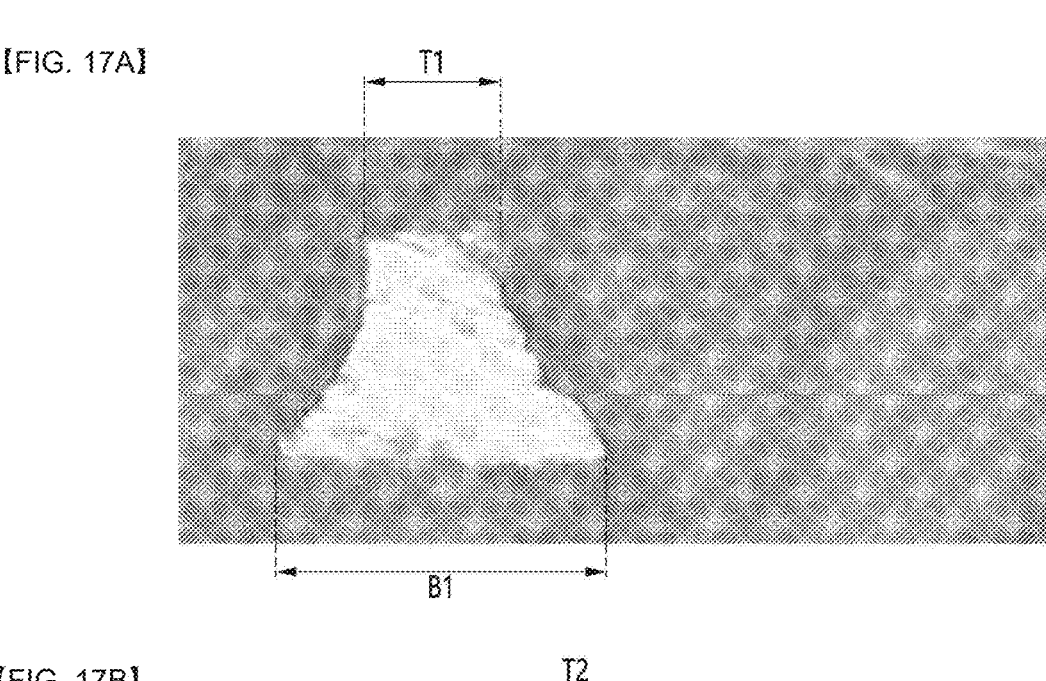
[FIG. 17B]
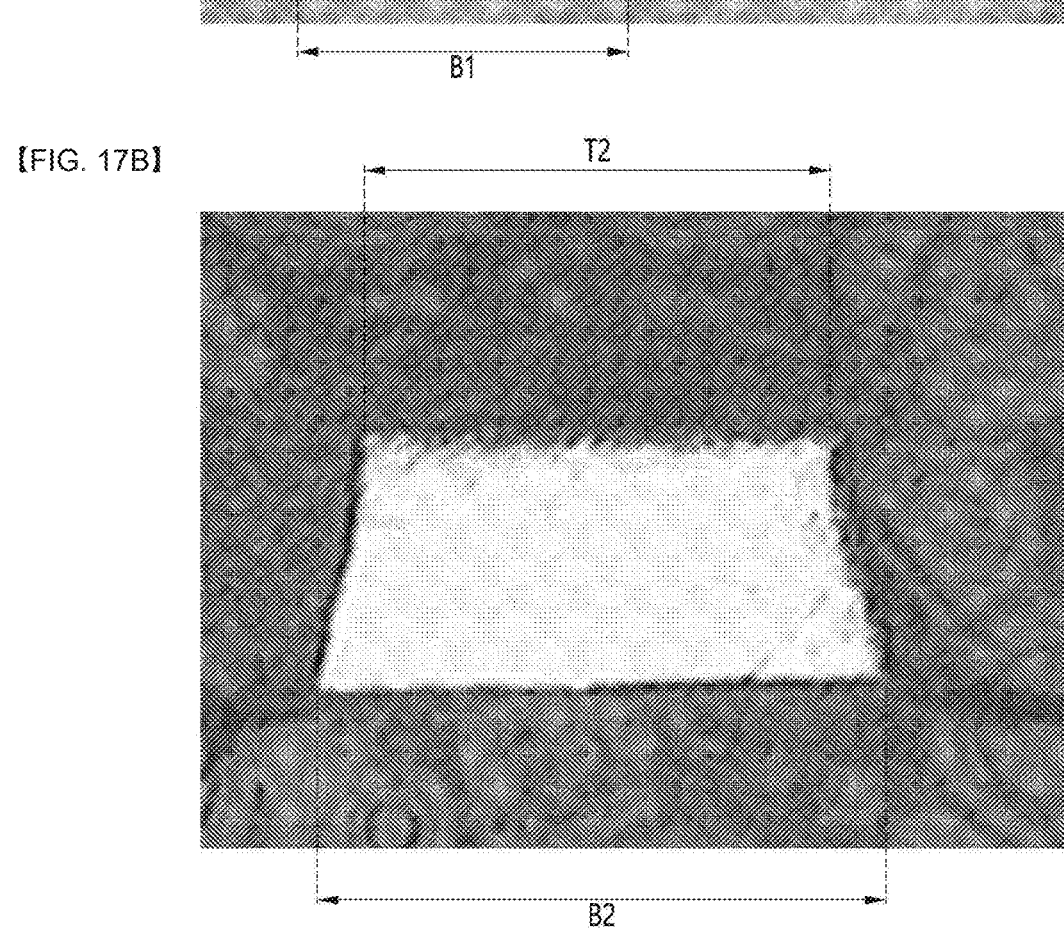

【FIG. 18】
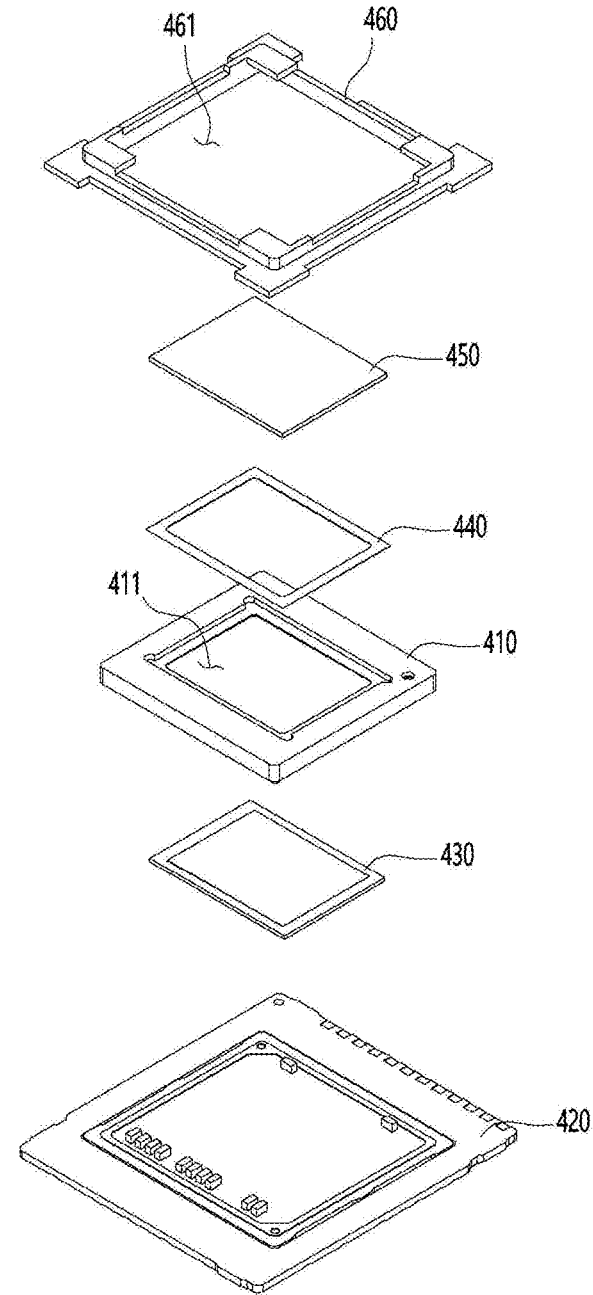

【FIG. 19】
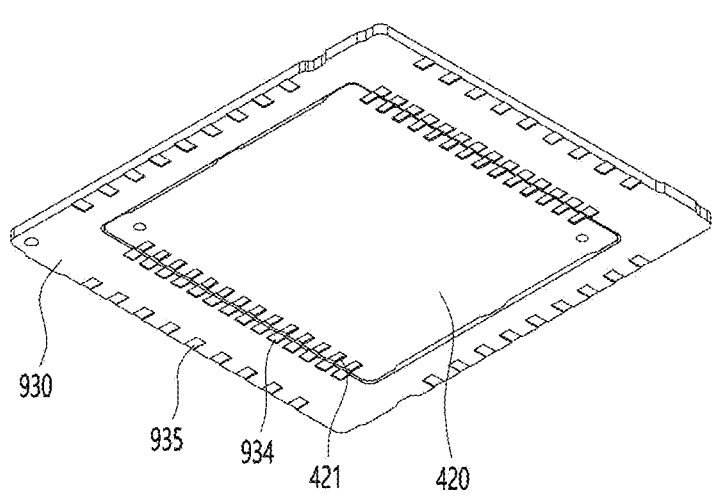

【FIG. 20】
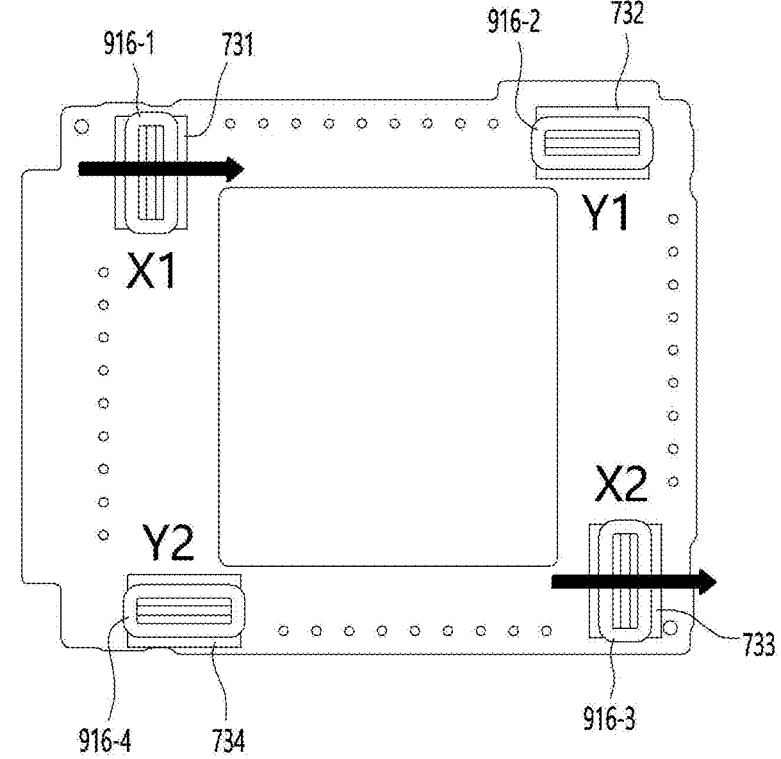
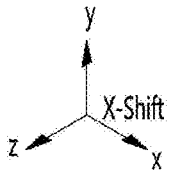

【FIG. 21】
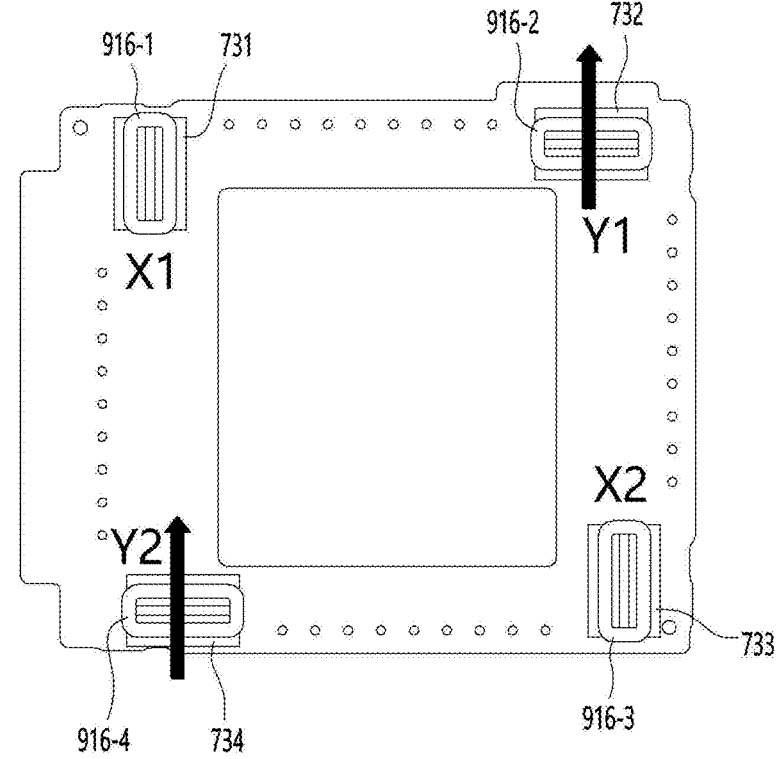
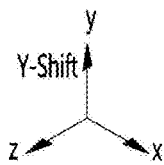

【FIG. 22】
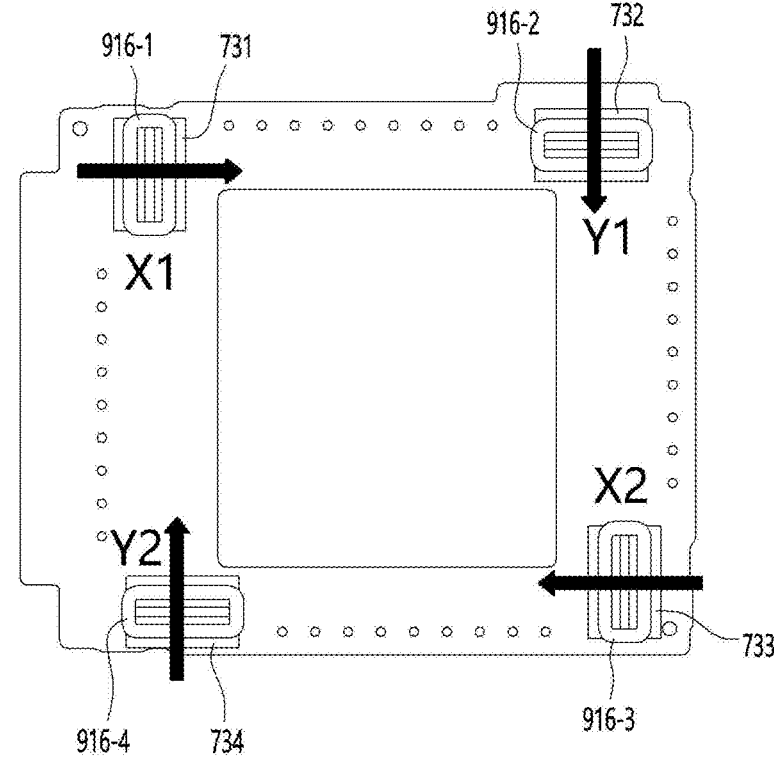
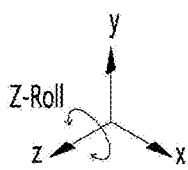

[FIG. 23A]
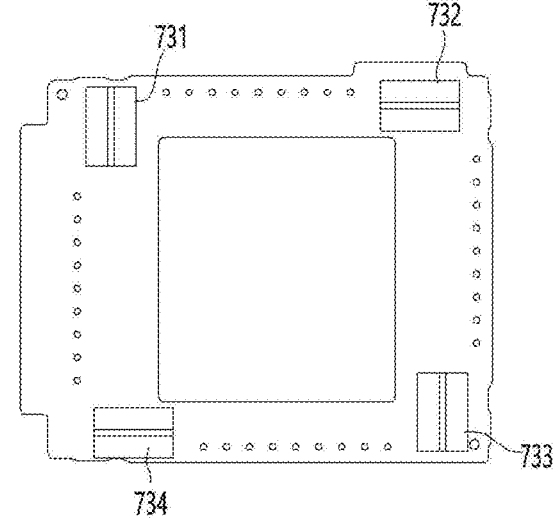
[FIG. 23B]
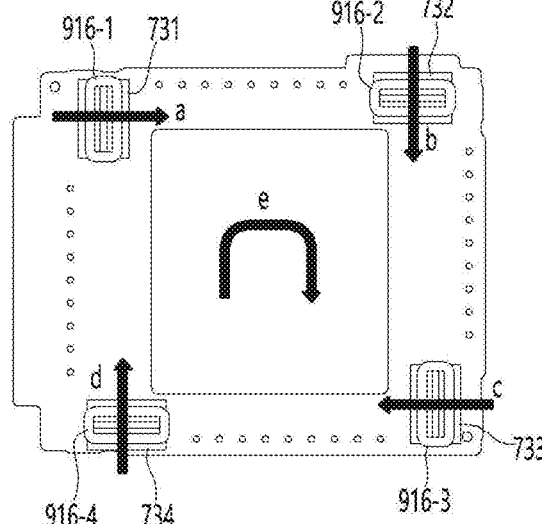

【FIG. 24】
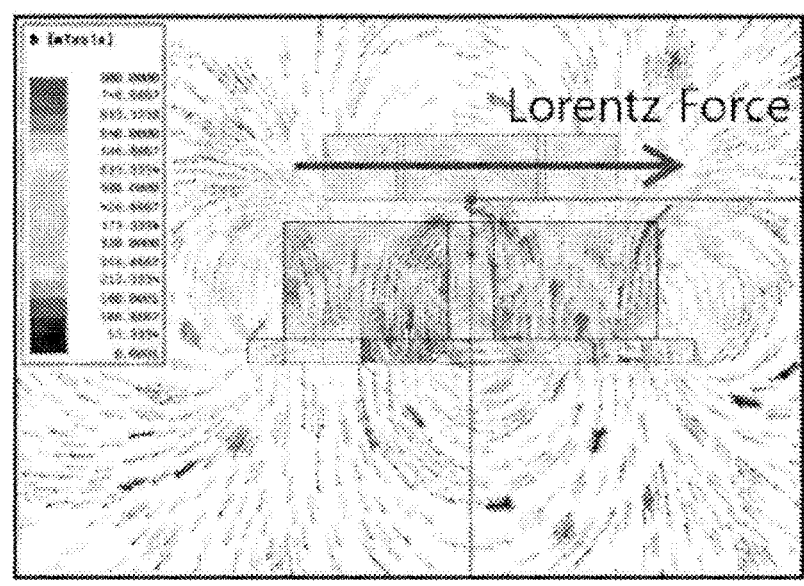
【FIG. 25】
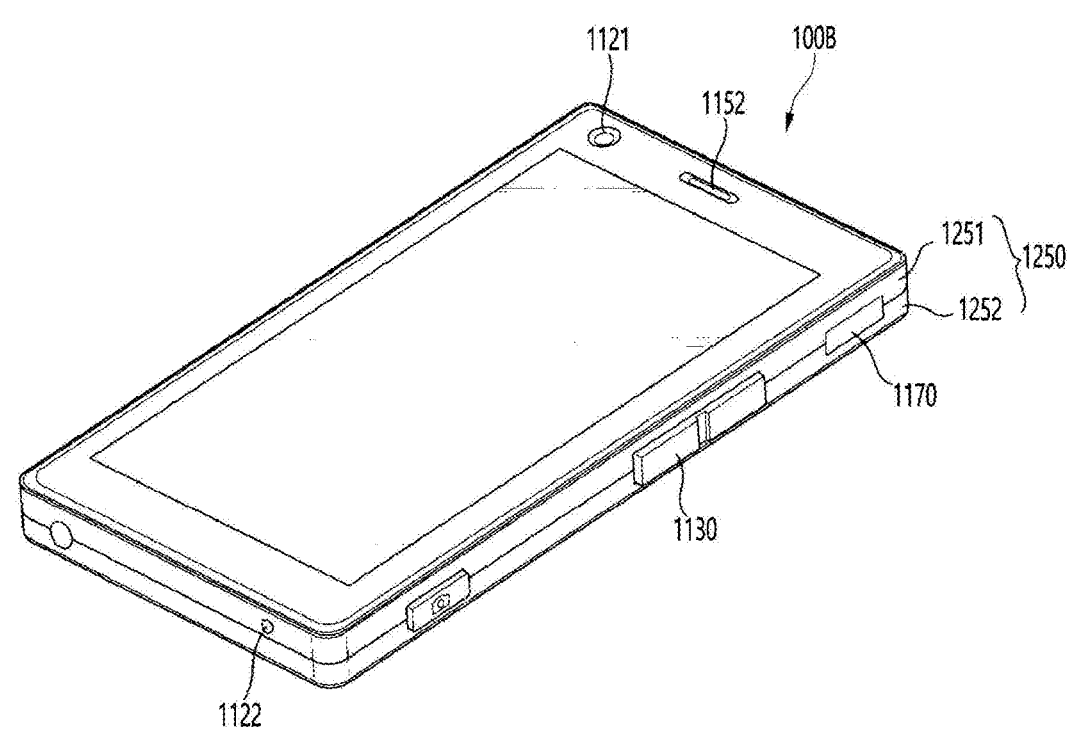

【FIG. 26】
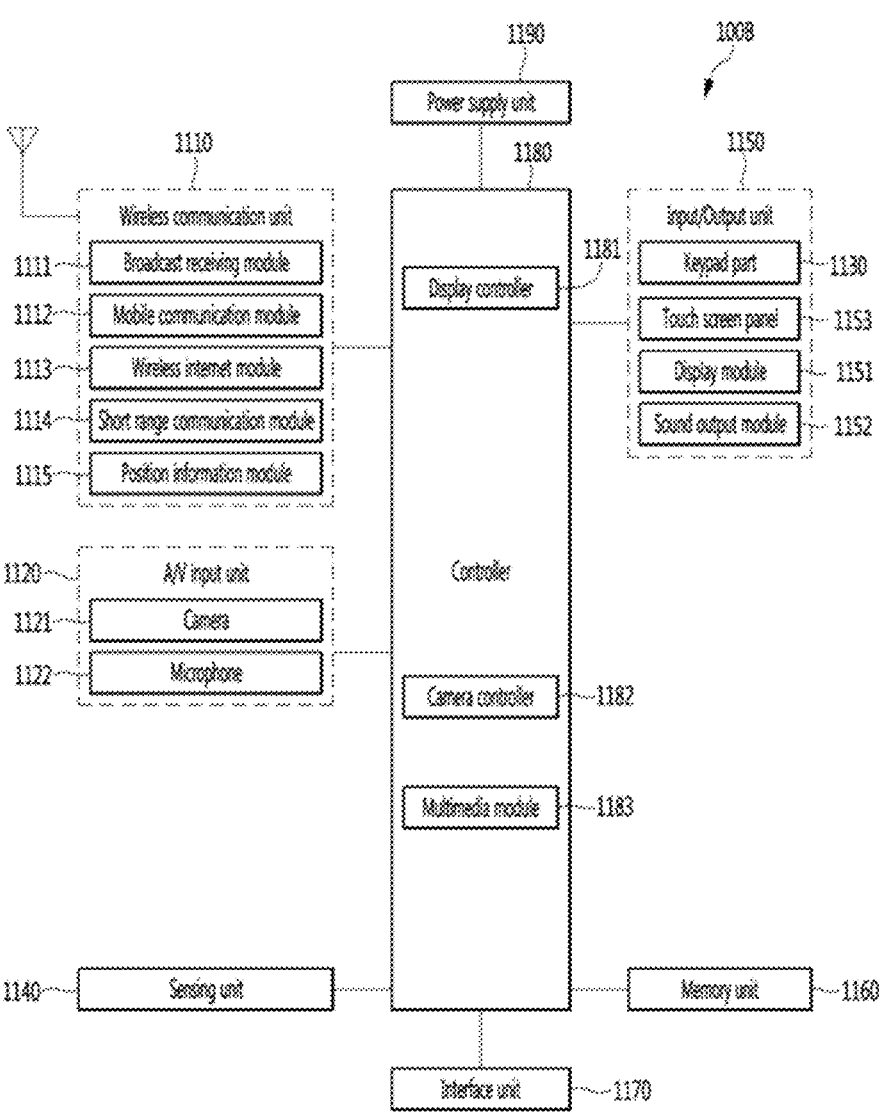

CIRCUIT BOARD

CROSS-REFERENCE TO RELATED APPLICATIONS

This application is a Continuation of U.S. patent application Ser. No. 17/921,778, filed on Oct. 27, 2022, which was filed as the National Phase of PCT International Application No. PCT/KR2021/005248, filed on Apr. 26, 2021, which claims priority under 35 U.S.C. 119(a) to Patent Application No. 10-2020-0050684, filed in the Republic of Korea on Apr. 27, 2020, all of which are hereby expressly incorporated by reference into the present application.

BACKGROUND

Field

An embodiment relates to a circuit board, and more particularly, to a circuit board for an image sensor, a sensor driving device, and a camera module including the same.

Discussion of the Related Art

As various portable terminals are widely used and the wireless Internet service is commercialized, needs of consumers related to the portable terminals are diversified, and various kinds of additional devices are installed in the portable terminals.

A representative one of them is a camera device for photographing a subject in a photograph or a moving image. Meanwhile, recent camera devices employ a camera shake correction function for preventing a phenomenon in which an image shakes due to camera shake of a photographer.

However, the lens shift in an x-axis/y-axis directions used in a conventional camera shake correction module has a limitation in correcting various kinds of camera shake.

SUMMARY OF THE DISCLOSURE

A present embodiment provides a circuit board capable of correcting hand shake for x-axis direction shift, y-axis direction shift, and rotation about the z-axis, an image sensor driving device, and a camera module including the same.

In addition, the present embodiment provides a circuit board in which hand shake correction through a lens and hand shake correction through an image sensor are performed together, an image sensor driving device, and a camera module including the same.

In addition, the present embodiment provides a circuit board that can simplify a spring structure for providing an autofocus function and a handshake compensation function, an image sensor driving device, and a camera module including the same.

In addition, the present embodiment provides a circuit board, an image sensor driving device, and a camera module including the same, which are included in the circuit board and can improve the reliability of the pattern portion having an electrical signal transmission function and a spring function.

Technical problems to be solved by the proposed embodiments are not limited to the above-mentioned technical problems, and other technical problems not mentioned may be clearly understood by those skilled in the art to which the embodiments proposed from the following descriptions belong.

A circuit board according to an embodiment includes an insulating layer; and a lead pattern portion disposed on the insulating layer, wherein the lead pattern portion includes: a first portion disposed on the insulating layer; and a second portion extending from one end of the first portion; wherein the first portion is disposed overlapping the insulating layer in a vertical direction, wherein the second portion is disposed in an outer region of the insulating layer and does not overlap the insulating layer; and wherein the lead pattern portion has a centerline average roughness in a range of 0.05 $\mu$m to 0.5 $\mu$m or a 10-point average roughness in a range of 1.0 $\mu$m to 5.0 $\mu$m In addition, the lead pattern portion has a tensile strength of at least 1000 N/mm2 or a 0.2% offset yield strength of at least 1000 N/mm$^2$.

In addition, the lead pattern portion includes: a metal layer; and a first plating layer disposed on the metal layer; and wherein the first plating layer has a centerline average roughness in a range of 0.05 $\mu$m to 0.5 $\mu$m or a 10-point average roughness in a range of 1.0 $\mu$m to 5.0 $\mu$m.

In addition, the lead pattern portion includes a metal layer, and wherein the metal layer has a centerline average roughness in a range of 0.05 $\mu$m to 0.5 $\mu$m or a 10-point average roughness in a range of 1.0 $\mu$m to 5.0 $\mu$m.

In addition, the lead pattern portion includes a second plating layer disposed on the metal layer, and wherein the second plating layer has a centerline average roughness in a range of 0.05 $\mu$m to 0.5 $\mu$m or a 10-point average roughness in a range of 1.0 $\mu$m to 5.0 $\mu$m.

In addition, the metal layer has a centerline average roughness in a range of 0.05 $\mu$m to 0.5 $\mu$m or a 10-point average roughness in a range of 1.0 $\mu$m to 5.0 $\mu$m.

In addition, a width of an upper surface of each of the first and second portions is in a range of 50% to 100% of a width of a lower surface.

In addition, the insulating layer has an opening, wherein the lead pattern portion includes: a third portion connected to the first portion through the second portion and including a through hole; and a fourth portion extending in an inner direction of the insulating layer from the other end of the first portion and disposed on the opening and not in contact with the insulating layer.

In addition, the second portion includes a region bent between the first portion.

In addition, the metal layer is a binary alloy or a ternary composite alloy containing at least one of nickel (Ni), tin (Sn), manganese (Mn), aluminum (Al), beryllium (Be), and cobalt (Co) in copper (Cu), and wherein the first plating layer is formed of the same metal material as the metal layer.

In addition, the circuit board includes a reinforcing pattern disposed on the insulating layer spaced apart from the lead pattern portion, the reinforcing pattern includes the same metal material as the lead pattern portion, and the reinforcing pattern has a centerline average roughness in a range of 0.05 $\mu$m to 0.5 $\mu$m or a 10-point average roughness in a range of 1.0 $\mu$m to 5.0 $\mu$m.

On the other hand, the sensor driving device according to the embodiment a magnet holder, a magnet portion coupled to the magnet holder; a fixed portion disposed on the magnet holder and including a first lead pattern portion; a moving portion spaced apart from the fixed portion at a predetermined interval and including an image sensor; and a plurality of wires disposed between the moving portion and the fixed portion, wherein the moving portion includes a circuit board including an insulating layer and a second lead pattern portion disposed on the insulating layer, wherein one end of the second lead pattern portion is electrically connected to the wire, the other end of the lead pattern portion is electrically connected to the image sensor, wherein at least one surface of the second lead pattern portion includes a metal layer having a centerline average roughness in a range of 0.05 µm to 0.5 µm or a 10-point average roughness in a range of 1.0 µm to 5.0 µm.

In addition, the insulating layer includes an opening in which the image sensor is disposed, wherein the second lead pattern portion includes a first portion disposed on the insulating layer; a second portion extending outwardly from one end of the first portion; a third portion connected to the first portion through the second portion and including a through hole through which the wire passes; and a fourth portion extending inwardly from the other end of the first portion, positioned on the opening, and electrically connected to the image sensor.

According to the embodiment, the image sensor is moved relative to the lens barrel in the X-axis, Y-axis, and Z-axis directions instead of moving the conventional lens barrel in order to realize OIS and AF functions of the camera module. Accordingly, the camera module according to the embodiment may remove a complicated spring structure for realizing the OIS and AF functions, thereby simplifying a structure. In addition, it is possible to form a stable structure compared to the related art by moving the image sensor according to the embodiment relative to the lens barrel.

In addition, the circuit board for an image sensor electrically connected to the image sensor according to the embodiment includes a pattern portion having a spring structure and floating in a position that does not overlap with the insulating layer in a vertical direction. In this case, the pattern portion has strength and tensile strength above a certain level. That is, the pattern portion of the embodiment should have elasticity for implementing the OIS and AF functions as well as the electrical signal transmission function. Accordingly, the pattern portion in the embodiment may be formed of a rolled material to have strength and tensile strength above a certain level. According to this, the pattern portion according to the embodiment may solve reliability problems such as pattern breakage occurring during OIS or AF functions. In detail, the circuit board for the image sensor according to the embodiment may stably move the image sensor with respect to the lens barrel while stably elastically supporting the image sensor, thereby improving operational reliability for OIS and AF.

In addition, the metal layer in the embodiment is a rolled material, and thus has a centerline average roughness (Ra) in a range of 0.025 µm to 0.035 µm or/and a 10-point average roughness in a range of 0.3 µm to 0.5 µm. In this case, when the metal layer has a roughness within the above range, the adhesion between the pattern portion and the insulating layer is reduced due to a small surface roughness, and thus the pattern portion is detached from the insulating layer.

Accordingly, the surface of the metal layer in the embodiment is surface-treated to have a surface roughness of a certain level or higher. The surface of the metal layer may be a lower surface in contact with or facing the insulating layer. In this case, the surface treatment of the lower surface in one embodiment may be performed by forming a plating layer on the lower surface of the metal layer. Also, the surface treatment in another embodiment may be performed by applying at least one of chemical polishing and physical polishing to the lower surface of the metal layer. In addition, the lower surface of the metal layer may have a centerline average roughness (Ra) in a range of 0.05 µm to 0.5 µm or/and a 10-point average roughness in a range of 1.0 µm to 5.0 µm by the surface treatment as described above. Accordingly, in the embodiment, a surface roughness of a certain level or higher may be imparted to the lower surface of the metal layer by surface treatment of the lower surface of the metal layer, and thus adhesion with the insulating layer may be improved. In addition, the embodiment may solve the reliability problem in which the pattern portion is detached from the insulating layer by improving the adhesion between the insulating layer and the pattern portion.

In addition, the upper surface of the metal layer in an embodiment is surface-treated to have a surface roughness of a certain level or higher. The upper surface of the metal layer may be a surface in contact with a photo resist (PR) during the formation of the pattern portion. In this case, the surface treatment may be performed by forming a plating layer on the upper surface of the metal layer in the same manner as the lower surface. Also, the surface treatment in another embodiment may be performed by performing soft etching or chemical coating on the upper surface of the metal layer. Accordingly, the upper surface of the metal layer may have a centerline average roughness (Ra) in the range of 0.05 µm to 0.5 µm or/and a 10-point average roughness in the range of 1.0 µm to 5.0 µm by the surface treatment as described above. Accordingly, in the embodiment, a surface roughness of a certain level or higher may be imparted to the upper surface of the metal layer by surface treatment of the upper surface of the metal layer, and thus adhesion with the PR may be improved. In addition, the embodiment may implement a high etching factor by improving the adhesion between the metal layer and the PR, thereby improving reliability. In detail, in the embodiment, as a high etching factor can be implemented, the width of the upper surface of the pattern portion may satisfy the range of 50% to 100% of the width of the lower surface of the pattern portion. Further, according to the embodiment, the noise characteristic of the signal transmitted through the pattern portion may be improved by improving the dimensional deviation of the width of the upper surface and the lower surface of the pattern portion.

According to the above-described embodiment, an X-axis direction shift, a Y-axis direction shift, and a Z-axis-centered rotation corresponding to camera shake with respect to the image sensor may be performed, and accordingly, the camera shake correction for the image sensor may be performed together with the camera shake correction for the corresponding lens, thereby providing a more improved image stabilization function.

In addition, it is possible to reduce a total height of the camera device according to the embodiment by embedding electrical elements required for a camera circuit by utilizing an internal space of the second actuator for moving the image sensor relative to the lens barrel.

In addition, a camera assembly process according to the embodiment may be simplified by integrating and fusing components of the camera circuit and components of the second actuator.

BRIEF DESCRIPTION OF THE DRAWINGS

FIG. 1 is a view illustrating a camera module according to a comparative example.

FIG. 2 is a perspective view of a camera device according to a present embodiment.

FIG. 3 is a cross-sectional view taken along line A-A' of FIG. 2.

FIG. 4 is an exploded perspective view of a camera device according to a present embodiment.

FIG. 5 is an exploded perspective view of a second actuator according to an embodiment.

FIG. 6 is a cross-sectional view schematically illustrating a connection relationship between a first substrate and a moving portion of FIG. 7.

FIG. 7 is an exploded perspective view of the fixed portion of FIG. 5.

FIG. 8 is a bottom view of the fixed portion of FIG. 5.

FIG. 9 is a view illustrating an upper surface of a first substrate in more detail.

FIG. 10 is an exploded perspective view of a moving portion according to an embodiment.

FIG. 11 is an exploded perspective view of a fourth substrate.

FIG. 12 is a plan view of a fourth substrate.

FIG. 13 is an enlarged view of a specific region of FIG. 12.

FIG. 14 is a view for explaining a peeling problem of a pattern portion according to a comparative example.

FIGS. 15A and 15B are views for explaining a surface roughness of a pattern portion according to a comparative Examples and an embodiment.

FIGS. 16A to 16C are views for explaining a surface treatment of a pattern portion according to an embodiment.

FIGS. 17A and 17B are views for explaining a cross-sectional shape of a pattern portion according to a comparative example and an embodiment.

FIG. 18 is an exploded perspective view of an image sensor module 400 according to an embodiment.

FIG. 19 is a view illustrating a combination of a third substrate and an image sensor module 400.

FIG. 20 is a view for explaining x-axis direction shift driving through some configurations of a camera device according to a present embodiment.

FIG. 21 is a view for explaining y-axis direction shift driving through some configurations of a camera device according to a present embodiment.

FIG. 22 is a view for explaining z-axis rotational driving through some configurations of a camera device according to a present embodiment.

FIG. 23A is a view illustrating a magnet disposed on a first substrate and a magnet holder along with an x-axis and a y-axis.

FIG. 23B is a view illustrating a first substrate, a magnet holder, a magnet and a coil with rotational driving in a z-axis direction.

FIG. 24 is a view illustrating a magnetic flow and a Lorentz force between a magnet and a coil of a camera device according to a present embodiment.

FIG. 25 is a perspective view of an optical device according to a present embodiment.

FIG. 26 is a block diagram of the optical device shown in FIG. 25.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, an embodiment of the present disclosure will be described in detail with reference to the accompanying drawings.

FIG. 1 is a view showing a camera module according to Comparative Example.

A camera module having an optical image stabilizer (OIS) function and an Auto Focusing (AF) function requires at least two spring plates.

The camera module according to the comparative example may have two spring plates. The camera module according to the comparative example requires an elastic member such as at least six springs for the spring plate.

Referring to FIG. 1, the camera module according to the comparative example includes an optical system including a lens assembly, an infrared cut-off filter, and a sensor unit. That is, the camera module according to the comparative example includes a lens barrel 10, a lens assembly 20, a first elastic member 31, a second elastic member 32, a first housing 41, a housing 42, an infrared cut-off filter 50, a sensor unit 60, a circuit board 80, and drivers 71, 72, 73, and 74.

In this case, the lens barrel 10 is connected to the first housing 41. That is, the lens barrel 10 is connected to the first housing 41 via the first elastic member 31. That is, the lens barrel 10 is connected to the first housing 41 so as to be movable by the first elastic member 31. In this case, the first elastic member 31 includes a plurality of springs (not shown). For example, the first elastic member 31 connects between the lens barrel 10 and the first housing 41 at a plurality of points of the lens barrel 10.

The second elastic member 32 is connected to the first housing 41 and the second housing 42 accommodating the first housing 41. The second elastic member 32 fixes the first housing 41 to the second housing 42 so as to be movable. The second elastic member 32 includes a plurality of springs. In detail, the second elastic member 32 includes a plate-shaped spring.

In this case, the first elastic member 31 moves the lens barrel 10 relative to the sensor unit 60 in a vertical direction (a Z-axis direction) while supporting the lens barrel 10. To this end, the first elastic member 31 includes at least four springs.

In addition, the second elastic member 32 moves the lens barrel 10 relative to the sensor unit 60 in a horizontal direction (an X-axis direction and a Y-axis direction) while supporting the lens barrel 10. To this end, the second elastic member 32 includes at least two springs.

As described above, in the camera module according to the comparative example, OIS and AF are performed as the lens barrel 10 moves in X-axis, Y-axis, and Z-axis directions. To this end, the camera module according to the comparative example requires at least six elastic members such as springs. In addition, the camera module according to the comparative example requires two spring plates for supporting the elastic member as described above. Further, the camera module according to the comparative example requires an additional member such as an elastic wire for fixing the Z-axis of the lens barrel 10. Therefore, the camera module according to the comparative example has a complicated spring structure for moving the lens barrel in the X-axis, Y-axis and Z-axis directions.

In addition, in the camera module according to the comparative example, it is necessary to manually perform an operation of bonding the respective elastic members in order to couple the elastic member with the lens barrel 10. Accordingly, the camera module according to the comparative example has a complicated manufacturing process and requires a long manufacturing time.

In addition, the camera module according to the comparative example provides a tilt function of the lens barrel 10, but has a structure in which tilt correction of an image is substantially difficult. That is, even though the lens barrel 10 rotates with respect to the sensor unit 60, an image incident on the sensor unit 60 does not change, and thus the tilt correction of the image is difficult, and further, the tilt function itself is unnecessary.

Hereinafter, an image sensor substrate, a camera module, and a camera device including the same according to an embodiment will be described.

"Optical axis direction" used below is defined as an optical axis direction of a lens and/or an image sensor coupled to a lens driving device.

"Vertical direction" used below may be a direction parallel to the optical axis direction. The vertical direction may correspond to "z-axis direction". "Horizontal direction" used below may be a direction perpendicular to the vertical direction. That is, the horizontal direction may be a direction perpendicular to the optical axis. Therefore, the horizontal direction may include "x-axis direction" and "y-axis direction".

"Auto focus function" used below is defined as a function for automatically adjusting a focus on a subject by adjusting a distance from an image sensor and moving a lens in the optical axis direction according to the distance of the subject so that a clear image of the subject may be obtained on the image sensor. Meanwhile, "auto focus" may correspond to "AF (Auto Focus)".

"Camera shake correction function" used below is defined as a function of moving the lens and/or the image sensor so as to cancel vibration (movement) generated in the image sensor by external force. Meanwhile, "Camera shake correction function" may correspond to "Optical Image Stabilization (OIS)".

FIG. 2 is a perspective view of a camera device according to an embodiment, FIG. 3 is a cross-sectional view taken along line A-A' of FIG. 2, and FIG. 4 is an exploded perspective view of the camera device to the embodiment.

The camera device in the embodiment may include a camera module. The camera device may include a lens driving device. Here, the lens driving device may be a voice coil motor (VCM). The lens driving device may be a lens driving motor. The lens driving device may be a lens driving actuator. The lens driving device may include an AF module. The lens driving device may include an OIS module.

<Camera Device>

A camera device may include a lens module 100.

The lens module 100 may include a lens and a lens barrel. The lens module 100 may include one or more lenses and a lens barrel capable of accommodating one or more lenses. However, one configuration of the lens module 100 is not limited to the lens barrel, and any holder structure that can support one or more lenses is possible. The lens module 100 is coupled to the first actuator 200 to move. The lens module 100 may be coupled to inside of the first actuator 200 as an example. Accordingly, the lens module 100 may move inside the first actuator 200 in response to a movement of the first actuator 200. The lens module 100 may be screw-coupled to the first actuator 200. As an example, the lens module 100 may be coupled to the first actuator 200 by an adhesive (not shown). Meanwhile, light passing through the lens module 100 may be irradiated to the image sensor. Meanwhile, the lens module 100 may include, for example, five lenses. The lens module 100 may include a liquid lens and a solid lens. The liquid lens contains conductive and non-conductive liquids, and an interface formed between the conductive liquid and the non-conductive liquid can be controlled by electrical force. The liquid lens may be a lens whose focal length is adjusted by adjusting the interface.

The camera device may include an actuator.

In detail, the camera device may include a first actuator 200 for shifting the lens module 100. The first actuator 200 may be an AF module. The first actuator 200 may move the lens module 100 in a vertical direction (obviously, an optical axis direction). That is, the first actuator 200 may perform an auto focus function by moving the lens module 100 in the optical axis direction.

A second actuator 600 may drive an image sensor 430. The second actuator 600 may tilt or rotate the image sensor 430. The second actuator 600 may move the image sensor 430. The second actuator 600 may move the image sensor 430 in a first direction perpendicular to an optical axis, move the image sensor 430 in a second direction perpendicular to the optical axis and the first direction, and rotate the image sensor 430 based on the optical axis. In this case, the first direction may be an x-axis direction, the second direction may be a y-axis direction, and the optical axis may be a z-axis direction.

Meanwhile, the first actuator 200 and the second actuator 600 may include a driver to move the lens module 100 and the image sensor 430, respectively. That is, the first actuator 200 may include a first driver (described later). In addition, the second actuator 600 may include a second driver (described later). Each of the first and second drivers may include a coil and a magnet. In addition, the coil and the magnet may generate an electromagnetic force therebetween to drive the lens module 100 and the image sensor 430, respectively.

The camera device may include a case. The case may include a first case 300 covering an upper region of the camera device. In addition, the case may include a second case 500 covering a lower region of the first case 300.

The image sensor module 400 may be coupled to the second actuator 600. Preferably, the second actuator 600 may be composed of a fixed portion (to be described later) and a moving portion (described later). In addition, the moving portion of the second actuator 600 may be connected to the fixed portion through a wire (described later). The moving portion of the second actuator 600 may move with respect to the fixed portion by the electromagnetic force of the second driving portion. Here, the movement of the fixed portion may include all of the movement in the first direction, a movement in the second direction, and a movement in the optical axis direction.

In addition, the image sensor module 400 may be coupled to the moving portion of the second actuator 600. The image sensor module 400 may include an image sensor 440. The image sensor 440 may be any one of a charge coupled device (CCD), a metal oxide semi-conductor (MOS), a CPD, and a CID.

In the present embodiment, the image sensor 440 may be rotated around an x-axis, a y-axis, and a z-axis. The image sensor 440 may move around the x-axis, the y-axis, and the z-axis. The image sensor 440 may be tilted around the x-axis, the y-axis, and the z-axis.

That is, the image sensor module 400 is coupled to the moving portion of the second actuator 600, and when the moving portion of the second actuator 600 moves relative to the fixed portion of the second actuator 600, it is possible to move relative to the fixed portion of the second actuator 600 together with the moving portion of the second actuator 600. As a result, the camera shake correction function may be performed.

As described above, in the embodiment, an AF function may be performed through the first actuator 200 or the liquid lens of the lens module, and a camera shake correction function may be performed through the second actuator 600. Alternatively, the second actuator 600 may perform both the AF function and the camera shake correction function.

The camera device according to the present embodiment moves the image sensor module 400 relative to the lens module 100 to perform the camera shake correction function and/or the auto focus function.

That is, recently, as the camera technology has been developed, an image resolution has been increased, thereby increasing a size of the image sensor 440. At this time, as the size of the image sensor 440 increases, a size of the lens module 100 and parts of the actuator for shifting the lens module 100 are also increase. Accordingly, as a weight of the other actuator components for shifting the lens module 100 as well as the weight of the lens module 100 increases, it is difficult to stably shift the lens module 100 using the conventional VCM technology, and a lot of problems occur in terms of reliability.

Accordingly, in the present embodiment, AF is performed using the first actuator 200 implementing a lens shift method, and OIS is executed using the second actuator 600 implementing the image sensor shift method, thereby, the reliability of the camera device is improved.

Furthermore, there is a 5-axis camera shake in the camera shake of the camera device. For example, in the 5-axis camera shake, there are two camera shakes that are shaken at an angle, two camera shakes that is shaken by a shift, and one camera shake that are shaken by rotation. At this time, only the 4-axis camera shake correction is possible with the lens shift method, and the camera shake that are shaken in rotation cannot be corrected. This is because the camera shake caused by rotation should be corrected by rotation of the optical module, and even when the lens module 100 is rotated, an incident optical path is maintained as it is, and accordingly, the 5-axis camera shake correction is not possible with the lens shift method. Therefore, in the present embodiment, it is possible to solve a reliability problem of the lens shift method according to the development of the camera technology as described above, while applying the sensor shift method so as to enable the 5-axis camera shake correction.

Hereinafter, each configuration of the camera device according to the embodiment will be described in more detail. In particular, the configuration of the second actuator among the configurations of the camera device according to the embodiment will be described in detail below.

<Second Actuator>

Hereinafter, the second actuator 600 will be described.

The second actuator 600 may be positioned under the first actuator 200 and operated separately from the first actuator 200 to shift the image sensor module 400.

To this end, the second actuator 600 may include a fixed portion 700 of which position is fixed, and a moving portion 800 of which position is moved by an electromagnetic force of a driver in a state in which the second actuator 600 is coupled to the fixed portion.

FIG. 5 is an exploded perspective view of a second actuator according to an embodiment, FIG. 6 is a cross-sectional view schematically illustrating a connection relationship between a first substrate and a moving portion of FIG. 5, FIG. 7 is an exploded perspective view of the fixed portion of FIG. 5, FIG. 8 is a bottom view of the fixed portion of FIG. 5, FIG. 9 is a view illustrating an upper surface of a first substrate in more detail, FIG. 10 is an exploded perspective view of a moving portion according to an embodiment, FIG. 11 is an exploded perspective view of a fourth substrate, FIG. 12 is a plan view of a fourth substrate, FIG. 13 is an enlarged view of a specific region of FIG. 12, FIG. 14 is a view for explaining a peeling problem of a pattern portion according to a comparative example, FIGS. 15A and 15B are views for explaining a surface roughness of a pattern portion according to a comparative example and an embodiment, FIGS. 16A to 16C are views for explaining a surface treatment of a pattern portion according to an embodiment, and FIGS. 17A and 17B are views for explaining a cross-sectional shape of a pattern portion according to a comparative example and an embodiment.

Referring to FIGS. 5 to 17B, the second actuator 600 may include a fixed substrate portion 700, a moving substrate portion 900, a connection wire 800, and a substrate housing 1000.

The fixed substrate portion 700 and the moving substrate portion 900 are electrically connected to each other by the connection wire 800. Here, a length of the connection wire 800 is larger than a sum of both thicknesses of the fixed substrate portion 700 and the moving substrate portion 900. Accordingly, the moving substrate portion 900 disposed below the fixed substrate portion 700 may be spaced apart from the fixed substrate portion 700 by a predetermined distance. That is, the moving substrate portion 900 may move relative to the fixed substrate portion 700 by an electromagnetic force generated by the magnet portion and the coil portion to be described later in the suspended state (flown state) to a lower portion of the fixed substrate portion 700 by the connection wire 800.

The connection wire 800 may connect the fixed substrate portion 700 and the moving substrate portion 900. The connection wire 800 may have elasticity. The connection wire 800 may be an elastic member. The connection wire 800 may be a wire spring. The connection wire 800 may connect between a circuit pattern portion of the fixed substrate portion 700 and a circuit pattern portion of the moving substrate portion 900 in a state in which the fixed substrate portion 700 is spaced apart from the moving substrate portion 900 at a predetermined interval. The connection wire 800 may be formed of metal. The connection wire 800 may elastically support a movement of the moving substrate portion 900.

The connection wire 800 may include a plurality of wires. The plurality of wires may correspond to the number of channels of signals exchanged between the moving substrate portion 900 and the fixed substrate portion 700. The connection wire 800 may include a total of thirty-six wires, nine each on side surface between adjacent corners of the four corners of the fixed substrate portion 700 and the moving substrate portion 900.

For example, the connection wire 800 may include nine first wires 810 disposed on each of first side surfaces of the fixed substrate portion 700 and the moving substrate portion 900, nine second wires 820 disposed on a second side surface, nine third wires 830 disposed on a third side surface, and nine fourth wires 840 disposed on the fourth side surface.

As described above, the connection wire 800 may be evenly distributed on four side surfaces. That is, the connection wire 800 may form and dispose a symmetrical structure with side surfaces facing each other at the four side surfaces. In this case, the connection wire 800 should elastically support the moving substrate portion 900 with respect to the fixed substrate portion 700 while transmitting a signal. In this case, when the connection wire 800 is asymmetrically disposed, a problem may occur in the reliability of the shift operation of the moving substrate portion 900. For example, when the connecting wire 800 is asymmetrically disposed, a difference may occur in the amount of movement between a portion in which a large number of connecting wires are disposed and a portion in which a small amount of the connecting wire is disposed, thereby causing a problem in operation reliability. Therefore, the connection wire 800 in the embodiment is uniformly distributed on each of the four side surfaces to improve the reliability of the image sensor shift operation.

The substrate housing 1000 is disposed below the fixed substrate portion 700 to accommodate the moving substrate portion 900 therein.

The second actuator 600 configured as described above will be specifically described as follows.

The fixed substrate portion 700 may include a first substrate 710, a magnet holder 720, and a magnet portion 730.

The first substrate 710 may include a first substrate region 711 in which a first opening 712 at a center thereof is formed, and a second substrate region 716 in which a connector extending from the first substrate region 711 and connected to an external device is disposed.

The first substrate 710 may include a first lead pattern portion 713 disposed in the first substrate region 711. The first lead pattern portion 713 of the first substrate 710 may be coupled to the connection wire 800. That is, one end of the connection wire 800 may be electrically coupled to the first lead pattern portion 713 of the first substrate 710. The first lead pattern portion 713 and the connection wire 800 may be coupled through soldering, but is not limited thereto. In this case, a solder resist may be opened for electrical connection with the connection wire 800 in a region where the first lead pattern portion 713 is disposed on the first substrate 710.

In detail, the first lead pattern portion 713 includes a first hole 713-2 and a lead pattern 713-1 disposed surrounding the first hole 713-2. That is, the first lead pattern portion 713 may be a pad including the first hole 713-2 through which the connection wire 800 passes. Accordingly, the connection wire 800 may be soldered in a state in which the connection wire 800 is passing through the first hole 713-2 to be electrically connected to the lead pattern 713-1 disposed around the first hole 713-2.

The first lead pattern portion 713 is configured in plurality. That is, the first lead pattern portion 713 includes a plurality of first lead patterns. In addition, the plurality of first lead patterns are connected to the connection wire 800. In this case, the number of the first lead patterns may be equal to or less than the number of the connection wires 800. When the number of the first lead patterns is the same as the number of the connection wires 800, all of the first lead patterns may be coupled to the connection wires. In addition, when the number of first lead patterns is less than the number of the connection wires 800, at least one of the first lead patterns may not be coupled to the connection wire.

The connector may be disposed in the second substrate region 716 connected to the first substrate region 711. The connector may be a port for electrically connecting with the external device.

In this case, the first substrate region 711 may be disposed in the camera device, and the second substrate region 716 may extend from the first substrate region 711 to be exposed to outside the camera device.

That is, the first substrate region 711 may be disposed inside the first case 300, and the second substrate region 716 may be disposed outside the first case 300 to include the connector connected to the external device.

The first substrate 710 may transmit a signal to the moving substrate portion 900, or may receive the signal transmitted from the moving substrate portion 900. That is, the first substrate 710 is electrically connected to the moving substrate portion 900 via a connection wire 800, and accordingly, a power signal or a communication signal (i.e., a sensing signal or an operation control signal) may be transmitted to the moving substrate portion 900 through the connection wire 800, and a signal including an image signal obtained by the moving substrate portion 900 may be received.

A first pad portion 714 may be disposed in an edge region of the first substrate region 711 of the first substrate 710. The first pad portion 714 may be electrically connected to the flexible circuit board 260 included in the first actuator 200.

At least one first coupling hole 715 is formed in a corner region of the first substrate region 711 of the first substrate 710. The first coupling hole 715 may be formed to fix the first substrate 710 on the magnet holder 720.

The first substrate 710 may be positioned in a fixed state within the first case 300 of the camera device. That is, the first substrate 710 may be disposed in a fixed state without moving.

The magnet holder 720 is disposed below the first substrate 710. The magnet holder 720 may be provided with a substrate seating portion 721 on which the first substrate 710 is seated. In addition, a first coupling protrusion 722 coupling to the first coupling hole 715 formed in the first substrate 710 may be formed in the substrate seating portion 721.

The first substrate 710 may be seated on the substrate seating portion 721 in the state in which the first coupling hole 715 is inserted into the first coupling protrusion 722.

In this case, the magnet holder 720 may include an open region overlapping the first opening 712 of the first substrate 710 in an optical axis direction. In addition, a position overlapping the first lead pattern portion 713 of the magnet holder 720 in the optical axis direction may be opened.

A gyro sensor 717 may be disposed on a lower surface of the first substrate 710. That is, the gyro sensor 717 according to the present embodiment may be disposed on a lower surface of the first substrate 710 and accommodated in the first case 300 of the camera device.

That is, in the present embodiment, the gyro sensor 717 for implementing an anti-shake function may be built in a state mounted on the lower surface of the first substrate 710, so that an angular velocity/linear velocity sensing information due to a camera shake may be fed back to the moving substrate portion 900. Accordingly, in an embodiment, the gyro sensor 717 is disposed in a space between the first substrate 710 and the moving substrate portion 900, and thus there is an effect in which it is not necessary to provide an additional space for disposing the gyro sensor 717.

A magnet-seating groove (not shown) in which the magnet portion 730 is disposed may be formed on a lower surface of the magnet holder 720. The magnet portion 730 may be disposed in the magnet-seating groove of the magnet holder 720. In this case, the magnet portion 730 may be disposed to face a coil portion 916 disposed on the moving substrate portion 900. In this case, when a current is applied to the coil portion 916, an electric field may be formed around the coil portion 916. When the current is applied to the coil portion 916, the coil portion 916 may move relative to the magnet portion 730 via electromagnetic interaction between the coil portion 916 and the magnet portion 730.

Meanwhile, as shown in FIG. 8, one end of the connection wire 800 may be coupled to the first lead pattern portion 713 of the first substrate 710, and pass through the first hole 713-2 constituting the first lead pattern portion 713 so as to extend to a lower portion of the first substrate 710.

As described above, the fixed substrate portion 700 may be configured such that the first substrate 710 is disposed on an upper surface of the magnet holder 720, and the magnet portion 730 is disposed on the lower surface thereof, based on the magnet holder 720. In addition, a gyro sensor obtaining sensing information necessary to perform camera shake correction may be disposed on the lower surface of the first substrate 710, and the signal obtained via the gyro sensor may be delivered to the moving substrate portion 900 via the connection wire 800.

A substrate housing 1000 may be disposed below the fixed substrate portion 700. The substrate housing 1000 is coupled below the fixed substrate portion 700. Preferably, the substrate housing 1000 may be provided with a seating portion (not shown) on which the magnet holder 720 constituting the fixed substrate portion 700 is mounted, and accordingly, the seating portion (not shown) may be coupled to the magnet holder 720. In addition, the moving substrate portion 900 is disposed in the substrate housing 1000 coupled to the magnet holder 720.

The moving substrate portion 900 may be electrically connected to the fixed substrate portion 700 via the connection wire 800, and move relative to the fixed substrate portion 700 by interaction between the magnet portion 730 and the coil portion 916.

To this end, the moving substrate portion 900 may include a second substrate 910, a substrate holder 920, a third substrate 930, and a fourth substrate 940. Here, that is, the second substrate 910, the third substrate 930, and the fourth substrate 940 may be a second substrate portion constituting the movable substrate 900. In addition, the first substrate 710 may be a first substrate portion constituting the fixed substrate portion 700.

The second substrate 910 may be a main substrate. The second substrate 910 may be a driving substrate for driving the second actuator.

The second substrate 910 may include a second opening 911. In this case, the second opening 911 may be overlapped with the first opening 712 formed in the first substrate 710 in an optical axis direction. The second substrate 910 may include a coil portion 916 disposed at each corner of the second substrate 910 and corresponding to the coil portion 916. In addition, a second hole 912 may be formed in an edge region of the second substrate 910. In this case, the second hole 912 may be aligned with the first hole 713-2 formed in the first substrate 710 in an optical axis direction. The second hole 912 may be a wire through-hole through which the connection wire 800 coupled to the first substrate 710 passes.

A third hole 922 may be formed at an edge region of the substrate holder 920. In this case, the third hole 922 may be aligned in an optical axis direction with the second hole 912 formed in the second substrate 910 and the first hole 713-2 formed in the first substrate 710. The third hole 922 may be a wire through-hole through which the connection wire 800 coupled to the first substrate 710 passes. Meanwhile, an opening may be provided at a center of the substrate holder 920.

The third substrate 930 may be disposed in the opening of the substrate holder 920.

The third substrate 930 may relay a connection among the image sensor module 400, the second substrate 910, and the fourth substrate 940.

—Circuit Board for Image Sensor—

The fourth substrate 940 also enables signal transmission while enabling shifting of the image sensor module 400. The fourth substrate 940 may be a circuit board for an image sensor on which the image sensor module 400 is mounted. The fourth substrate 940 may be a key component in the configuration of the camera module in the embodiment. The fourth substrate 940 may be elastically and electrically coupled to the connection wire 800. Here, elastically coupled may mean that an elastic force is applied so that the image sensor module 400 can move relative to the fixed substrate portion 700 by the electromagnetic force. In addition, electrically coupled may mean being electrically connected to other components so as to transmit a signal to the fixed substrate portion 700 or receive a signal transmitted from the fixed substrate portion 700. Accordingly, the pattern portion 942 included in the fourth substrate 940 should perform an electrical wiring function for transmitting an electrical signal and a spring function for applying the elastic force. This will be described in detail.

The fourth substrate 940 may include an insulating layer 941 and a pattern portion 942 disposed on the insulating layer 941.

The insulating layer 941 may include an opening 941-2. The opening 941-2 may be aligned in an optical axis direction with an opening of the first substrate 710, an opening of the second substrate 910, an opening of the third substrate 930, and an opening of the substrate holder 920.

A pattern portion 942 is disposed on the insulating layer 941. At this time, although not shown in the drawing, an adhesive layer (not shown) for improving adhesion may be additionally disposed between the insulating layer 941 and the pattern portion 942.

In this case, the pattern portion 942 includes a second lead pattern portion 942-1 having one end thereof connected to the third substrate 930 and the other end thereof connected to the connection wire 800. In addition, the pattern portion 942 includes a reinforcing pattern 942-2 disposed on a corner region of the insulating layer 941.

The second lead pattern portion 942-1 is a circuit pattern for electrically connecting to the third substrate 930 and the connection wire 800 and for transmitting and receiving signals accordingly.

In addition, the reinforcing pattern 942-2 may be disposed on the corner region of the insulating layer 941. The reinforcing pattern 942-2 may be electrically separated from the second lead pattern portion 942-1. For example, the reinforcing pattern 942-2 may be disposed to be spaced apart from the second lead pattern portion 942-1 by a predetermined interval. The reinforcement pattern 942-2 may impart rigidity to the fourth substrate 940. Accordingly, the reinforcing pattern 942-2 may not be electrically connected to other components, and the reinforcing pattern 942-2 is only disposed in a corner region of the upper surface of the insulating layer 941 where the second lead pattern portion 942-1 is not disposed to improve the rigidity of the fourth substrate 940. In this case, the reinforcing pattern 942-2 may be formed by etching the same metal layer as the second lead pattern portion 942-1. In addition, the reinforcing pattern 942-2 may be formed together with the second lead pattern portion 942-1 when the second lead pattern portion 942-1 is formed. Accordingly, the embodiment has an advantage in that it is not necessary to dispose an additional member for improving the rigidity of the fourth substrate 940. In detail, in the embodiment, the reinforcement pattern 942-2 may be formed together with the second lead pattern portion 942-1 by using a part of the metal layer for forming the second lead pattern portion 942-1. Accordingly, an additional metal layer or an additional process for forming the reinforcing pattern 942-2 is unnecessary.

A plurality of second lead pattern portions 942-1 may be formed. The fourth substrate 940 may include, for example, 36 terminal portions (specifically, 36 second lead pattern portions serving as a terminal) in the same number as the number of connection wires 800.

In this case, the second lead pattern portion 942-1 may include a second-first lead pattern part 942-1a disposed in the first region of the insulating layer 941. In addition, the second lead pattern portion 942-1 may include a second-second lead pattern part 942-1b disposed in a second region of the insulating layer 941 adjacent to the second-first lead pattern part 942-1a. In addition, the second lead pattern portion 942-1 may include a second-third lead pattern part 942-1c disposed in a third region facing the first region of the insulating layer 941 and adjacent to the second region. In addition, the second lead pattern portion 942-1 may include a second-fourth lead pattern part 942-1d disposed in a fourth region between the first and third regions while facing the second region of the insulating layer 941. That is, the second lead pattern portion 942-1 may include a plurality of lead patterns respectively disposed in different regions of the insulating layer 941. That is, the second-first lead pattern part 942-1a may include nine second-first lead patterns. In addition, the second-second lead pattern part 942-1b may include nine second-second lead patterns. In addition, the second-third lead pattern part 942-1c may include nine second-third lead patterns. In addition, the second-fourth lead pattern part 942-1d may include nine second-fourth lead patterns.

In this case, the number of the second lead patterns may be equal to or less than the number of the connection wires. When the number of the second lead patterns is the same as the number of the connection wires, all of the second lead patterns may be coupled to the connection wires. In addition, when the number of second lead patterns is less than the number of the connection wires, at least one of the second lead patterns may not be coupled to the connection wire.

In addition, the reinforcing pattern 942-2 may include a first reinforcing pattern 942-2a disposed in a first corner region between the first region and the second region of the insulating layer 941, second reinforcing pattern 942-2b disposed in a second corner region between the second region and the third region of the insulating layer 941, a third reinforcing pattern 942-2c disposed in a third corner region between the third and fourth regions of the insulating layer 941, and a fourth reinforcing pattern 942-2d disposed in a fourth corner region between the first region and the fourth region of the insulating layer 941.

In this case, an insulating layer 941 has an opening 942-2 in a center. In addition, an insulating layer 941 includes a first insulating region 941-1 contacting the second lead pattern portion 942-1 and the reinforcing pattern 942-2. In addition, an insulating layer 941 includes a second insulating region 941-3 protruding in an outward direction from an outer surface of the first insulating region 941-1.

The second insulating region 941-3 supports the reinforcing pattern 942-2, and accordingly, a contact area between the insulating layer 941 and the reinforcing pattern 942-2 may be increased to further improve the rigidity of the fourth substrate 940.

Meanwhile, the reinforcing pattern 942-2 may further include a coupling hole 943-3, into which a coupling protrusion (not shown) disposed on a lower surface of the substrate holder 920 is inserted.

Meanwhile, each of the lead patterns constituting the second lead pattern portion 942-1 includes a first portion 942-11 disposed on the insulating layer 941. In addition, each of the lead patterns constituting the second lead pattern portion 942-1 includes a second portion 942-12 extending from the first portion 942-11 toward an outside of the insulating layer 941. The second portion 942-12 may not overlap the insulating layer 941 in a vertical direction or an optical axis direction. That is, the second portion 942-12 may not contact the insulating layer 941. In addition, each of the lead patterns constituting the second lead pattern portion 942-1 includes a third portion 942-13 extending outward from the second portion 942-12. The third portion 942-13 may be electrically connected to or coupled to the connection wire 800. The second portion 942-12 may connect between the first portion 942-11 and the third portion 942-13. Each of the lead patterns constituting the second lead pattern portion 942-1 may include a fourth portion 942-14 extending in an inner direction of the insulating layer 941 from the first portion 942-11. The fourth portion 942-14 may be electrically connected to the third substrate 930.

Here, the first portion 942-11 may be referred to as a 'body portion' of the second lead pattern portion 942-1. That is, the first portion 942-11 is disposed on the insulating layer 941, and accordingly, it may be a body portion supporting the second portion 942-12, the third portion 942-13, and the fourth portion 942-14.

In addition, the third portion 942-13 may be referred to as a 'coupling portion' coupled to the connection wire 800. In addition, the second portion 942-12 may be referred to as a 'connection portion' connecting the first portion 942-11 and the third portion 942-13. In addition, the fourth portion 942-14 may be referred to as a 'coupling portion' coupled to the third substrate 930, and may also be referred to as a 'pad portion'.

In addition, a hole through which the connection wire 800 passes may be formed in the third portion 942-13. The third portion 942-13 may be coupled to the connection wire 800 by soldering. The second portion 942-12 may include a bent portion. The second portion 942-12 may be bent at a plurality of times in one direction. The second portion 942-12 may have elasticity. Accordingly, the second lead pattern portion 942-1 may have elasticity.

In this case, when the second portion 942-12 does not include a bent portion, the connecting wire 800 may be bent in the moving direction when the image sensor module 400 moves, and breaking may occur depending on the degree and number of occurrences of the warpage. Alternatively, the second portion 942-12 in the embodiment includes a bent portion, and the bent portion may serve as a suspender when the image sensor module 400 moves. Accordingly, the bent portion of the second portion 942-12 of the second lead pattern portion 942-1 in the embodiment may impart elasticity to the connecting wire 800, and accordingly, the rigidity of the connection wire 800 may be increased.

The fourth portion 942-14 may be electrically connected to the third substrate 930.

On the other hand, only the first portion 942-11 of the second lead pattern portion 942-1 in the embodiment is disposed on the insulating layer 941, and a portion other than this is not disposed on the insulating layer 941. That is, only the lower surface of the first portion 942-11 of the second lead pattern portion 942-1 in the embodiment may contact the upper surface of the insulating layer 941. In addition, the second portion 942-12, the third portion 942-13, and the fourth portion 942-14 of the second lead pattern portion 942-1 in the embodiment may not be in contact with the insulating layer 941. At this time, when an adhesive layer (not shown) is additionally disposed between the insulating layer 941 and the pattern portion 942 as described above, the first portion 942-11 may contact the adhesive layer other than the insulating layer 941.

Meanwhile, the third portion 942-13 may be a bonding pad electrically connected to the connection wire 800. That is, the third portion 942-13 may be a soldering pad that are soldered with the connection wire 800. To this end, the third portion 942-13 may include a through hole through which the connection wire 800 passes. In addition, the through hole may be aligned with the third hole 922 of the substrate holder 920, the second hole 912 of the second substrate 910, and the first hole 713-2 of the first substrate 710 in the optical axis direction.

In addition, as described above, the second portion 942-12 may connect between the first portion 942-11 and the third portion 942-13. To this end, the second portion 942-12 may include a plurality of bent portions. In this case, a second portion of each of the second lead pattern portions 942-1a, 942-1b, 942-1c, and 942-1d may be bent in the same direction. For example, the second portion 942-12 of each of the second lead pattern portions 942-1a, 942-1b, 942-1c, and 942-1d, may include a bent portion that rotates clockwise.

That is, the second portion 942-12 may be bent in a direction corresponding to a rotation direction in the z-axis direction of the image sensor module. Accordingly, the second portion 942-12 may minimize damage to the second lead pattern portion 942-1 when rotating in the z-axis direction. In addition, it is possible to prevent cracks generated in the second lead pattern portion 942-1 or detachment of the second lead pattern portion 942-1 from the insulating layer 941.

Meanwhile, the adhesive layer that may be disposed between the insulating layer 941 and the pattern portion 942 may be implemented as a curing adhesive, but is not limited thereto. In addition, the adhesive layer may be electrolytically plated to increase adhesion or adhesion between the insulating layer 941 and the second lead pattern portion 942-1, and thus roughness may be imparted to the surface. The adhesive layer may include at least one metal material selected from Ni, Cr, Pd, Au, and Ag.

Meanwhile, the second lead pattern portion 942-1 is a wire for transmitting an electrical signal, and may be formed of a metal material having high electrical conductivity. To this end, the second lead pattern portion 942-1 may be formed of at least one metal material selected from among gold (Au), silver (Ag), platinum (Pt), titanium (Ti), tin (Sn), copper (Cu), and zinc (Zn). In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength.

Preferably, the second lead pattern portion 942-1 may serve as a wiring for transmitting an electrical signal, and may be formed of a metal material having an elastic force capable of moving the image sensor module 400 in the X-axis, Y-axis, and Z-axis directions.

To this end, the second lead pattern portion 942-1 may be formed of a metal material having a tensile strength of 1000 MPa (1000 N/mm$^2$) or more. For example, the second lead pattern portion 942-1 may be a binary alloy or a ternary alloy including copper. In detail, the second lead pattern portion 942-1 may include a binary alloy or a ternary composite alloy containing copper (Cu) as a main component and at least one metal of nickel (Ni), tin (Sn), manganese (Mn), aluminum (Al), beryllium (Be) and cobalt (Co).

For example, the second lead pattern portion 942-1 may be a binary alloy of copper (Cu)-nickel (Ni). For example, the second lead pattern portion 942-1 may be a ternary alloy of copper (Cu)-nickel (Ni)-tin (Sn).

Meanwhile, the second lead pattern portion 942-1 may be formed by a general process of manufacturing a printed circuit board, such as an additive process, a subtractive process, a modified semi additive process (MSAP), a semi additive process (SAP), etc.

Meanwhile, the second lead pattern portion 942-1 may have different line widths for each portion. The first portion 942-11 may have a wider width than the other portion to increase a contact area with the insulating layer 941. In addition, the second portion 942-12 may have a narrower line width compared with the first portion 942-11 to have an elastic force. For example, the second portion 942-12 may have a line width of 20 μm to 1000 μm. For example, the second portion 942-12 may have a line width of 30 μm to 800 μm. For example, the second portion 942-12 may have a line width of 50 μm to 500 μm. When the line width of the second portion 942-12 is smaller than 20 μm, overall rigidity of the second lead pattern portion 942-1 may be lowered, thereby lowering reliability of the second lead pattern portion 942-1. In addition, when the line width of the second portion 942-12 is larger than 1000 μm, an elastic force of the second lead pattern portion 942-1 may be lowered, which may cause a problem in a shift of the image sensor module 400.

Meanwhile, the second portion 942-12 may include a buffer pattern portion for a buffering role in a region A connected to the first portion 942-11. The buffer pattern portion may have a shape in which a width gradually decreases in a direction from the first portion 942-11 to the second portion 942-12. In this case, the width reduction is not linear but has a non-linear characteristic, and accordingly, an outer surface of the buffer pattern portion may have a rounded or curved shape.

The buffer pattern portion may solve a problem such as a pattern break caused by a pattern width difference between the first portion 942-11 and the second portion 942-12, and stably connect between the first portion 942-11 and the third portion 942-13.

In addition, the buffer pattern portion may not be overlapped with the insulating layer in a vertical direction. Accordingly, when the substrate is not only moved in the X, Y and Z axes, but also tilted, a point in which the connection portion and the pattern portion are connected is not existed on the insulating layer, and is formed outside the insulating layer, and thus pattern breakage caused by a difference in width between the connection portion and the pattern portion can be effectively reduced.

In addition, the fourth portion 942-14 may also have a line width smaller than that of the first portion 942-11, and accordingly, a buffer pattern portion having a rounded or curved outer surface may be disposed in a region B between the fourth portion 942-14 and the first portion 942-11.

Meanwhile, the second portion 942-12 may be bent at least once as set above. Accordingly, the second portion 942-12 includes a second-first portion 942-12a extending in one direction and a second-second portion 942-12b that is bent in a direction different from the one direction in the second-first portion 942-12a.

In this case, a side surface of the second-second portion 942-12b may have a rounded shape or a curved shape instead of a straight line. That is, when the side surface of the second-second portion 942-12b has a straight shape, stress may be concentrated on the portion, and accordingly, breakage of the second lead pattern portion 942-1 may occur. Accordingly, the side surface of the second-second portion 942-12b has a rounded or curved shape to prevent concentration of stress in the second-second portion 942-12b. A curvature-R value of the side surface of the second-second portion 942-12b may have a value between 30 and 100. For example, a curvature-R value of the side surface of the second-second portion 942-12b may have a value between 40 and 90. For example, a curvature-R value of the side surface of the second-second portion 942-12b may have a value between 50 and 80.

When the curvature-R value of the side surface is smaller than 30, the stress concentration preventing effect is insufficient, and when larger than 100, an elastic force of the second lead pattern portion 942-1 may decrease. In this case, the second-second portion 942-12b may include an inner surface and an outer surface along the bending direction. In addition, a curvature-R value of the inner surface of the second-second portion 942-12b may be different from that of the outer surface of the second-second portion 942-12b to maximize a role of stress relaxation.

In addition, the second-second portion 942-12b may be different from the line width of the second-first portion 942-12a. For example, the second-second portion 942-12b may have a line width larger than that of the second-first portion 942-12a. This is, the stress may be concentrated in the second-second portion 942-12b and accordingly, the second-second portion 942-12b may be formed while having a line width larger than that of the second-first portion 942-12a.

Meanwhile, the third substrate 930 may be positioned on the fourth portion 942-14. In addition, the fourth portion 942-14 and the third substrate 930 may be coupled to each other through soldering.

Meanwhile, in the above description, the second portion 942-12 of the second lead pattern portion 942-1 has a rectangular shape with rounded corners, but is not limited thereto. For example, the second portion 942-12 of the second lead pattern portion 942-1 may have a circular shape or a polygonal shape and may be bent.

Meanwhile, the second-first lead pattern part 942-1a and the second-third lead pattern part 942-1c of the second lead pattern portion 942-1 in the embodiment may be spaced apart from each other in a longitudinal direction on the insulating layer 941. In addition, the second-second lead pattern part 942-1b and the second-fourth lead pattern part 942-1d of the second lead pattern portion 942-1 may be disposed in a width on the insulating layer 941.

At this time, each lead patterns of the second-first lead pattern part 942-1a and each lead patterns of the second-third lead pattern part 942-1c may be disposed to be spaced apart by an internal P1 in the longitudinal direction. For example, each lead patterns of the second-first lead pattern part 942-1a and each lead patterns of the second-third lead pattern part 942-1c may be spaced apart at an interval of 0.1 mm to 7 mm in the longitudinal direction. For example, each lead patterns of the second-first lead pattern part 942-1a and each lead patterns of the second-third lead pattern part 942-1c may be spaced apart at an interval of 0.5 mm to 5 mm in the longitudinal direction. For example, each lead patterns of the second-first lead pattern part 942-1a and each lead patterns of the second-third lead pattern part 942-1c may be spaced apart at an interval of 0.6 μmm to 3 mm in the longitudinal direction. For example, each lead patterns of the second-first lead pattern part 942-1a and each lead patterns of the second-third lead pattern part 942-1c may be spaced apart at an interval of 0.7 mm to 2 mm in the longitudinal direction.

In this case, a first interval P1 may mean a distance between holes of the third portions 942-3 included in an adjacent lead patterns. In this case, when the first interval P1 is smaller than 0.1 mm, a short circuit problem may occur as adjacent lead patterns contact each other when the image sensor module 400 is shifted. In addition, when the first interval P1 is greater than 7 mm, a size of the fourth substrate 940 may increase.

At this time, each lead patterns of the second-second lead pattern part 942-1b and each lead patterns of the second-fourth lead pattern part 942-1d may be disposed to be spaced apart by a second internal P2 in the width direction. For example, each lead patterns of the second-second lead pattern part 942-1b and each lead patterns of the second-fourth lead pattern part 942-1d may be spaced apart at an interval of 0.1 mm to 7 mm in the width direction. For example, each lead patterns of the second-second lead pattern part 942-1b and each lead patterns of the second-fourth lead pattern part 942-1d may be spaced apart at an interval of 0.5 mm to 5 mm in the width direction. For example, each lead patterns of the second-second lead pattern part 942-1b and each lead patterns of the second-fourth lead pattern part 942-1d may be spaced apart at an interval of 0.6 mm to 3 mm in the width direction. For example, each lead patterns of the second-second lead pattern part 942-1*b* and each lead patterns of the second-fourth lead pattern part 942-1*d* may be spaced apart at an interval of 0.7 mm to 2 mm in the width direction. In this case, the second interval P2 may mean a distance between holes of the third portions 942-3 included in an adjacent lead patterns.

Hereinafter, a metal layer of the pattern portion 942 according to the embodiment will be described.

The pattern portion 942 including the second lead pattern portion 942-1 and the reinforcing pattern 942-2 may be formed by etching the same metal layer.

In this case, the reinforcing pattern 942-2 only serves as a mechanical function for securing rigidity, and thus there is no significant restriction on the material forming the reinforcing pattern 942-2.

However, the second lead pattern portion 942-1 should function as a wiring for transmitting an electrical signal and function as a spring for imparting elastic force.

Accordingly, the pattern portion 942 in the embodiment may be formed of a metal layer having hardness and tensile strength of a certain level or more so as to perform both a wiring function and a spring function.

In this case, the pattern having only a general wiring function may be formed of a metal layer of an electrolytic material. However, although the metal layer of the electrolytic material as described above may perform a wiring function, the spring function cannot be performed due to low tensile strength and hardness.

Accordingly, the pattern portion 942 in the embodiment may be formed using a metal layer of a rolled material. In detail, the pattern portion 942 may be formed of a binary or ternary composite alloy containing copper as a main component and at least one of Ni, Co, Mn, and Al.

The metal layer may have a tensile strength of a predetermined level or more and a 0.2% offset yield strength (0.2% offset yield strength).

For example, the metal layer may have a tensile strength of 500 N/mm$^2$ or more. The metal layer may have a tensile strength of 800 N/mm$^2$ or more. For example, the metal layer may have a tensile strength of 1000 N/mm$^2$ or more. For example, the metal layer may have a tensile strength of 1400 N/mm$^2$ or more. For example, the metal layer may have a 0.2% offset yield strength of 500 N/mm$^2$ or more. For example, the metal layer may have a 0.2% offset yield strength of 800 N/mm$^2$ or more. Also, for example, the metal layer may have a 0.2% offset yield strength of 1000 N/mm$^2$ or more. For example, the metal layer may have a 0.2% offset yield strength of 1400 N/mm$^2$ or more.

In this case, a tensile strength of a metal layer of a general electrolytic material may be in the range of 100 N/mm$^2$ to 400 N/mm$^2$. Accordingly, the metal layer of the electrolytic material cannot satisfy the characteristics that the second lead pattern portion 942-1 should have. In detail, the metal layer of the electrolytic material may satisfy the characteristics for the wiring function, but may not satisfy the characteristics for the spring function.

Here, the metal layer of a general rolled material has a centerline average roughness (Ra) in a range of 0.025 μm to 0.035 μm or/and a 10-point average roughness in a range of 0.3 μm to 0.5 μm. In this case, when the metal layer has a roughness within the above range, the adhesion between the pattern portion 942 and the insulating layer 941 is reduced due to a low surface roughness, and thus, there is a problem in that the pattern portion is separated from the insulating layer.

Referring to FIG. 14, when the metal layer of the second lead pattern portion 942-1 has a centerline average roughness Ra in a range of 0.025 μm to 0.035 μm or/and a 10-point average roughness in a range of 0.3 μm to 0.5 μm, a problem in that the second lead pattern portion 942-1 in a C region is separated from the insulating layer 941 may occur.

Accordingly, the embodiment improves the adhesion between the pattern portion 942 and the insulating layer 941 by performing a surface treatment on the surface of the metal layer constituting the pattern portion 942.

That is, a surface treatment in the embodiment is performed on the surface of the metal layer so that the surface of the metal layer has a surface roughness of a certain level or more.

In this case, the surface of the metal layer may include a lower surface in contact with the insulating layer 941 and an upper surface opposite to the lower surface. Here, the surface treatment in the embodiment may be proceed with the same surface treatment for the upper and lower surfaces of the metal layer, or may be different surface treatments for the upper and lower surfaces of the metal layer. Accordingly, when the same surface treatment is performed on the upper and lower surfaces of the metal layer, the upper and lower surfaces of the metal layer may have surface roughness corresponding to each other. In addition, when different surface treatments are performed on the upper and lower surfaces of the metal layer, the upper and lower surfaces of the metal layer may have different surface roughness.

Here, a surface roughness of the lower surface of the metal layer may affect adhesion to the insulating layer 941. In addition, a surface roughness of the upper surface of the metal layer may affect adhesion with a photoresist (PR) formed on the upper surface of the metal layer in the process of forming the pattern portion 942 using the metal layer. In addition, the surface roughness of the upper surface of the metal layer may affect an etching factor in the etching process of forming the pattern portion 942. That is, the etching factor may increase as the adhesion between the metal layer and the photoresist increases. Further, a numerical deviation between the width of the upper surface and the width of the lower surface of the pattern portion 942 may decrease as the etching factor increases.

Therefore, surface treatment in the embodiment is performed on the upper and lower surfaces of the metal layer to increase the adhesion between the pattern portion 942 and the insulating layer 941, and furthermore, a high etching factor can be realized during the etching process by increasing adhesion with the photoresist.

In this case, the surface treatment in the embodiment may be performed by plating the surface of the metal layer with a separate metal material to form a plating layer.

Alternatively, the surface treatment in the embodiment may be formed by performing chemical polishing, physical polishing, soft etching, or chemical coating on the surface of the metal layer.

Referring to FIG. 15A, it can be seen that the surface of a general rolled material has a relatively low surface roughness. Alternatively, the surface treatment in the embodiment is performed on the metal layer of the rolled material. And, as shown in FIG. 15B, the surface of the metal layer that has been subjected to surface treatment as in the embodiment may have a surface roughness that is clearly distinguished from the rolled material in FIG. 15A.

For example, the upper surface and the lower surface of the metal layer in the embodiment may have the same surface roughness, and may have different surface roughness. For example, the upper surface and the lower surface of the metal layer in the embodiment may each have a centerline average roughness (Ra) in a range of 0.05 μm to 0.5 μm. For example, the upper surface and the lower surface of the metal layer in the embodiment may each have a centerline average roughness (Ra) in a range of 0.05 μm to 0.2 μm. For example, the upper surface and the lower surface of the metal layer in the embodiment may each have a centerline average roughness (Ra) in a range of 0.08 μm to 0.15 μm. For example, the upper surface and the lower surface of the metal layer in the embodiment may each have a 10-point average roughness (Rz) in a range of 0.6 to 5 μm. For example, the upper surface and the lower surface of the metal layer in the embodiment may each have a 10-point average roughness (Rz) in a range of 0.7 to 3.0 μm. For example, the upper surface and the lower surface of the metal layer in the embodiment may each have a 10-point average roughness (Rz) in a range of 1.0 to 2.5 μm.

That is, the surface-treated metal layer in the embodiment may have a surface roughness of 10 times or more compared to the metal layer before the surface treatment. For example, the surface-treated metal layer in the embodiment may have a surface roughness of 20 times or more compared to the metal layer before the surface treatment.

Hereinafter, the surface-treated metal layer according to the embodiment will be described in detail.

As shown in FIG. 16A, the surface treatment of the metal layer in a first embodiment may be performed by plating a plating layer on the surface.

Accordingly, the metal layer of the pattern portion 942 in the embodiment includes a metal layer 942a of a rolled material, a first plating layer 942b formed on a lower surface of the metal layer 942a, and a second plating layer 942c formed on the upper surface of the metal layer 942a.

The first plating layer 942b and the second plating layer 942c may be formed by plating the upper and lower surfaces of the rolled metal layer 942a, which is a raw material, with a metal material, respectively. In this case, the first plating layer 942b and the second plating layer 942c may be formed of the same metal material as the metal material constituting the metal layer 942a, respectively.

For example, each of the first plating layer 942b and the second plating layer 942c may be formed of a binary or ternary composite alloy containing copper as a main component and at least one of Ni, Co, Mn, and Al.

In this case, the first plating layer 942b may be formed on the lower surface of the metal layer 942a to have a first thickness T1. For example, the first thickness T1 may have a range of 0.1 μm to 10 μm. For example, the first thickness T1 may have a range of 0.2 μm to 8 km. For example, the first thickness T1 may have a range of 0.3 μm to 5 μm. When the first thickness T1 is smaller than 0.1 μm, it may be possible to implement a surface shape having a surface roughness of a certain level or higher on the lower surface of the metal layer 942a. That is, when the first thickness T1 is less than 0.1 μm, the surface roughness required in the embodiment may not be satisfied. Also, when the first thickness T1 is greater than 10 μm, an overall volume of the pattern portion 942 may increase due to an increase in thickness. In addition, when the first thickness T1 is greater than 10 μm, a plating cost for forming the first plating layer 942b may increase, and thus a product cost may increase.

In this case, the second plating layer 942c may be formed on the upper surface of the metal layer 942a to have a second thickness T2. The second thickness T2 may have a range of 0.1 μm to 10 μm. The second thickness T2 may have a range of 0.2 μm to 8 μm. The second thickness T2 may have a range of 0.3 μm to 5 μm. When the second thickness T2 is less than 0.1 μm, it may be possible to implement a surface shape having a surface roughness of a predetermined level or higher on the upper surface of the metal layer 942a. That is, when the second thickness T2 is less than 0.1 μm, the surface roughness required in the embodiment may not be satisfied. In addition, when the second thickness T2 is greater than 10 μm, an overall volume of the pattern portion 942 may increase due to an increase in thickness. In addition, when the second thickness T2 is greater than 10 μm, a plating cost for forming the second plating layer 942c may increase, and thus a product cost may increase.

Meanwhile, in the first embodiment as described above, a surface roughness of a certain level or higher is imparted to the surface of the metal layer 942a by using plating. Accordingly, the surface roughness of the metal layer 942a in the first embodiment may substantially mean the surface roughness of the lower surface of the first plating layer 942b and the surface roughness of the upper surface of the second plating layer 942c.

In this case, when the surface roughness is imparted by using plating, the manufacturing cost may increase according to the progress of the plating process. Accordingly, plating in the second embodiment may be performed on only one of the upper and lower surfaces of the metal layer 942a, and the other surface may be subjected to surface treatment through polishing or etching.

As shown in FIG. 16B, a first plating layer 942b may be formed on the lower surface of the metal layer 942a. At this time, since the first plating layer 942b has already been described above, a detailed description thereof will be omitted.

Meanwhile, an upper surface 942T1 of the metal layer 942a may be surface-treated through polishing or etching. Specifically, chemical polishing or physical polishing is performed on the upper surface 942T1 of the metal layer 942a to impart a certain level or more of surface roughness to the upper surface of the metal layer 942a. In this case, when the surface treatment is performed by chemical polishing, an acidic chemical that can corrode raw materials such as iron chloride or sulfuric acid can be used. In addition, when the surface treatment is performed by physical polishing, surface roughness may be imparted to the upper surface 942T1 of the metal layer 942a using a brush, sandpaper, abrasive stone, or the like.

In this case, the polishing process may be performed by a second depth T2 on the upper surface of the metal layer 942a. The second depth T2 may have a value substantially corresponding to the second thickness. That is, the second depth T2 may have a range of 0.1 μm to 10 μm.

In addition, although it has been described above that the first plating layer 942b is formed on the lower surface of the metal layer 942a and polishing is performed on the upper surface of the metal layer 942a, the embodiment is not limited thereto. For example, surface treatment may be performed by forming a second plating layer 942c on the upper surface of the metal layer 942a and polishing the lower surface of the metal layer 942a.

Meanwhile, the upper surface and the lower surface of the metal layer 942a in the third embodiment may be polished to provide a surface roughness of a certain level or higher.

Referring to FIG. 16C, an upper surface 942T1 of the metal layer 942a may be subjected to a surface treatment using polishing as described in the second exemplary embodiment to provide a surface roughness of at least a certain level. In addition, a surface roughness of a certain level or higher may be imparted to the lower surface 942B1 of the metal layer 942a by performing a surface treatment using polishing instead of forming a plating layer. Since the polishing method has already been described with reference to FIG. 16B, a detailed description thereof will be omitted.

On the other hand, the surface roughness of the lower surface of the metal layer 942a is more important than the surface roughness of the upper surface of the metal layer 942a. That is, the lower surface of the metal layer 942a is a surface in contact with the insulating layer 941, and thus the surface roughness greatly affects the operational reliability of the camera module.

Accordingly, the lower surface of the metal layer 942a of the embodiment is provided with a surface roughness of a certain level or more by forming the first plating layer 942b, and the upper surface 942T1 of the metal layer 942a may be provided with surface roughness by using polishing.

In conclusion, the surface treatment of the lower surface of the metal layer 942a in the embodiment may be performed by forming the first plating layer 942b on the lower surface of the metal layer 942a. Also, the surface treatment of the lower surface in another embodiment may be performed by applying at least one of chemical polishing and physical polishing to the lower surface of the metal layer 942a.

Accordingly, the lower surface of the metal layer 942a (the lower surface of the first plating layer 942b when plating is performed) may have a centerline average roughness Ra in a range of 0.05 μm to 0.5 μm by the surface treatment as described above. For example, the lower surface of the metal layer 942a may have a centerline average roughness Ra in a range of 0.05 μm to 0.2 μm. For example, the lower surface of the metal layer 942a may have a centerline average roughness Ra in a range of 0.08 μm to 0.15 μm. For example, the lower surface of the metal layer 942a may have a 10-point average roughness Rz in a range of 0.6 to 5 μm. For example, the lower surface of the metal layer 942a may have a 10-point average roughness Rz in a range of 0.7 to 3.0 μm. For example, the lower surface of the metal layer 942a may have a 10-point average roughness Rz in a range of 1.0 to 2.5 μm. Accordingly, the lower surface of the metal layer 942a in the embodiment may be provided with a surface roughness of a certain level or more by surface-treating the lower surface of the metal layer 942a, and accordingly, adhesion to the insulating layer 941 may be improved. In addition, the reliability problem in which the pattern portion 942 is peeled from the insulating layer 941 can be solved by improving the adhesion between the insulating layer 941 and the pattern portion 942.

In addition, in the embodiment, the upper surface of the metal layer 942a is surface-treated to have a surface roughness of a certain level or higher. The upper surface of the metal layer 942a may be a surface in contact with a photo resist (PR) during the formation of the pattern portion 942. In this case, the surface treatment may be performed by forming a second plating layer 942c on the surface of the metal layer 942a in the same manner as the lower surface. Also, the surface treatment of the upper surface in another embodiment may be performed by soft etching or chemical coating on the surface of the metal layer 942a. Accordingly, the upper surface of the metal layer 942a (the upper surface of the second plating layer 942c when plating is performed) may have a centerline average roughness Ra in a range of 0.05 μm to 0.5 μm by the surface treatment as described above. For example, the upper surface of the metal layer 942a may have a centerline average roughness Ra in a range of 0.05 μm to 0.2 μm. For example, the upper surface of the metal layer 942a may have a centerline average roughness Ra in a range of 0.08 μm to 0.15 μm. For example, the upper surface of the metal layer 942a may have a 10-point average roughness Rz in a range of 0.6 to 5 μm. For example, the upper surface of the metal layer 942a μmay have a 10-point average roughness Rz in a range of 0.7 to 3.0 μm. For example, the upper surface of the metal layer 942a may have a 10-point average roughness Rz in a range of 1.0 to 2.5 μm. Accordingly, the upper surface of the metal layer 942a of the embodiment may have a surface roughness of a certain level or higher by performing surface treatment on the upper surface of the metal layer 942a, and accordingly, it is possible to improve adhesion with the PR. In addition, a high etching factor can be implemented, and thus reliability can be improved by improving the adhesion between the metal layer 942a and the PR.

That is, referring to FIG. 17A, when a photoresist is formed on a metal layer of a rolled material without surface treatment as in the embodiment and etching is performed using the formed photoresist, a high etching factor of the level of the present embodiment cannot be implemented. This means that the metal layer on which the surface treatment has not been performed has a lower surface roughness compared to this embodiment, and this is because the adhesion with the photoresist is lowered. Accordingly, when the surface treatment is not performed, a difference between the width T1 of the upper surface of the pattern portion and the width B1 of the lower surface of the pattern portion is twice or more. For example, if surface treatment is not performed, the width (T1) of the pattern portion is about 24.41 μm, and the width (B1) of the lower surface is about 56.30 μm.

Alternatively, referring to FIG. 17B, when the surface treatment is performed as in the embodiment, the adhesion between the metal layer 942a and the photoresist can be improved, and accordingly, a high etching factor can be implemented. Accordingly, the pattern portion 942 in the embodiment can reduce the width deviation between the upper and lower surfaces compared to the comparative example. Preferably, the width T2 of the upper surface of the pattern portion 942 in the embodiment may have a range of 50% to 100% of the width B2 of the lower surface. Preferably, the width T2 of the upper surface of the pattern portion 942 in the embodiment may have a range of 80% to 100% of the width B2 of the lower surface. Preferably, the width T2 of the upper surface of the pattern portion 942 in the embodiment may have a range of 90% to 99% of the width B2 of the lower surface.

That is, the ratio of the width T2 of the upper surface to the width B2 of the lower surface of the pattern portion 942 in the embodiment may have a range of 1:2 to 1:1. Accordingly, the embodiment can improve the dimensional deviation of the width of the upper surface and the lower surface of the pattern portion, and thus the noise characteristic of the signal transmitted through the pattern portion can be improved.

<Image Sensor Module>

FIG. 18 is an exploded perspective view of an image sensor module 400 according to an embodiment, and FIG. 19 is a view illustrating a combination of a third substrate and an image sensor module 400.

Referring to FIGS. 18 and 19, the image sensor module 400 may include a sensor holder 460, a filter 450, the adhesive member 440, a sensor base 410, the image sensor 430, and an image sensor substrate 420.

Such an image sensor module 400 may be coupled to the second substrate 910 and the substrate holder 920 via the sensor holder 460. For example, the image sensor module 400 may be fixed to the substrate holder 920 via the sensor holder 460. The image sensor module 400 may include the sensor holder 460, the filter 450, the adhesive member 440, the sensor base 410, the image sensor 430, and the image sensor substrate 420, but at least one of configurations may be omitted.

The image sensor module 400 may include the sensor holder 460. The sensor holder 460 allows the image sensor module 400 to be stably fixed to the substrate holder 920. In this case, the sensor holder 460 may include an opening 461, and the opening 461 may be aligned with the filter 450 and the image sensor 430 in an optical axis direction.

The image sensor module 400 includes the sensor base 410.

The sensor base 410 may include an opening 411, and a stepped protrusion may be provided to allow the filter 450 to be seated adjacent to the opening 411. In addition, the adhesive member 440 may be disposed on the stepped protrusion, and the filter 450 may be fixedly disposed on the adhesive member 440. Such a filter 450 may serve to block light of a specific frequency band of light passing through the lens module 100 from being incident on the image sensor 430. The filter 450 may be disposed to be parallel to an x-y plane. The filter 450 may be disposed between the lens module 100 and the image sensor 430. The filter 450 may include an infrared filter. The infrared filter may absorb or reflect infrared light incident on the infrared filter.

The image sensor substrate 420 may be a package substrate. That is, the image sensor 430 may be mounted in a package form on the image sensor substrate 420. The image sensor substrate 420 may include a printed circuit board (PCB). The image sensor substrate 420 may include a circuit board. The image sensor 430 may be disposed on the image sensor substrate 420. The image sensor substrate 420 may be coupled to the third substrate 930. To this end, a sixth pad portion 421 electrically connected to the fifth pad portion 935 of the third substrate 930 may be provided on a lower surface of the image sensor substrate 420. In this case, as described above, the sixth pad portion 421 is also disposed at edge regions opposite to each other on the lower surface of the image sensor substrate 420, and accordingly, positions of the pads to which the image signal is transmitted can be separated from the other pads. Meanwhile, the image sensor substrate 420 may be positioned in the opening of the third substrate 930, and the sixth pad portion 421 in the opening of the third substrate 930 may be aligned with the fifth pad portion 935 of the third substrate 930 in a horizontal direction. The fifth pad portion 935 and the sixth pad portion 421 may be coupled to each other via soldering or the like.

The image sensor 430 may have a configuration in which light passing through the lens module 100 and the filter 450 is incident to form an image. The image sensor 430 may be mounted on the image sensor substrate 420. The image sensor 430 may be electrically connected to the image sensor substrate 420. For example, the image sensor 430 may be coupled to the image sensor substrate 420 by surface mounting technology (SMT). As another example, the image sensor 430 may be coupled to the image sensor substrate 420 by flip chip technology. The image sensor 430 may be disposed to coincide with the lens module 100 in an optical axis. That is, the optical axis of the image sensor 430 and the optical axis of the lens module 100 may be aligned. The image sensor 430 may convert light irradiated to the effective image region of the image sensor 430 into an electrical signal. In addition, the converted electrical signal may be an image signal. The image sensor 430 may be any one of a charge coupled device (CCD), a metal oxide semi-conductor (MOS), a CPD, and a CID.

<Image Sensor Module Shift Driving Operation>

Hereinafter, a shift operation of the image sensor module 400 will be described.

FIG. 20 is a view for explaining x-axis direction shift driving through some configurations of a camera device according to a present embodiment, FIG. 21 is a view for explaining y-axis direction shift driving through some configurations of a camera device according to a present embodiment, FIG. 22 is a view for explaining z-axis rotational driving through some configurations of a camera device according to a present embodiment, FIG. 23A is a view illustrating a magnet disposed on a first substrate and a magnet holder along with a x-axis and a y-axis, FIG. 23B is a view illustrating a first substrate, a magnet holder, a magnet and a coil with rotational driving in a z-axis direction, and FIG. 24 is a view illustrating a magnetic flow and a Lorentz force between a magnet and a coil of a camera device according to a present embodiment.

As shown in FIG. 20, when currents in the same direction are applied to the first coil 916-1 and the third coil 916-3 in the present embodiment, the image sensor 430 coupled to the image sensor module 400 may be moved (shifted) in the x-axis direction by electromagnetic interaction between the first magnet 731 and the third magnet 733, respectively. That is, the first coil 916-1, the first magnet 731, and the third coil 916-3 and the third magnet 733 may be used for the x-axis direction shift drive of the image sensor 430. In this case, the first coil 916-1 and the first magnet 731 may be a first x-axis shift driver X1, and the third coil 916-3 and the third magnet 733 may be a second x-axis shift driver X2.

As shown in FIG. 21, when currents in the same direction are applied to the second coil 916-2 and the fourth coil 916-4 the present embodiment, the image sensor 430 coupled to the image sensor module 400 may be moved (shifted) in the y-axis direction by electromagnetic interaction between the second magnet 732 and the fourth magnet 734, respectively. That is, the second coil 916-2, the second magnet 732, the fourth coil 916-4, and the fourth magnet 734 may be used for the y-axis direction shift drive of the image sensor 430. In this case, the second coil 916-2 and the second magnet 732 may be a first y-axis shift driver Y1, and the fourth coil 916-4 and the fourth magnet 734 may be a second y-axis shift driver Y2.

As shown in FIG. 22, currents in opposite directions are applied to the first coil 916-1 and the third coil 916-3 and currents in opposite directions are applied to the second coil 916-2 and the fourth coil 916-4 in the present embodiment, and at this time, when a direction in which the coin portion 916 is rotated by the current applied to the first coil 916-1 and the current applied to the second coil 916-2 is the same, the image sensor 430 coupled to the image sensor module 400 may be rotated (rolled) around the z-axis. An embodiment shown in FIG. 22 illustrates a case in which the coil portion 916 is controlled by four channels, and when the coil portion 916 is controlled by three channels, the image sensor 430 may be rolled by the first coil 916-1 and the third coil 916-3 or the second coil 916-2 and the fourth coil 916-4. This is because when there is a coil bundled into one channel among the first coil 916-1 and the third coil 916-3, and the second coil 916-2 and the fourth coil 916-4, the current may not be applied in the opposite direction.

As shown in FIG. 23B, in the present embodiment, a forward current is applied to the first coil 916-1, whereby the first coil 916-1 is pushed in a first direction a (see FIG. 23A) with respect to the first magnet 731, a forward current is applied to the second coil 916-2, whereby the second coil 916-2 is pushed in a second direction b (see FIG. 23B) with respect to the second magnet 732, a reverse current is applied to the third coil 916-3, whereby the third coil 916-3 is pushed in a third direction c (see FIG. 23B) with respect to the third magnet 733, and a reverse current is applied to the fourth coil 916-4, whereby the fourth coil 916-4 is pushed in a fourth direction d (see FIG. 23B) with respect to the fourth magnet 734, so that the image sensor 430 coupled to the image sensor module 400 may be rotated around the z-axis (see e in FIG. 23B). In this case, the first to fourth directions may correspond to a clockwise direction around the center of the substrate holder 410.

In the present embodiment, a magnetic flow of the magnet portion 730 is shown in FIG. 24. Referring to FIG. 24, it may be confirmed that lines of magnetic force passing perpendicular to the coil portion 916 exists, and when a current is applied to the coil portion 916 in this state, the coil portion 916 may move with respect to the magnet portion 730 by the Lorentz force.

<Optical Device>

FIG. 25 is a perspective view of an optical device according to the present embodiment, and FIG. 26 is a block diagram of the optical device shown in FIG. 25.

The optical device may be any one of a mobile phone and a portable phone, a smart phone, a portable smart device, a digital camera, a laptop computer, a digital broadcasting terminal, a personal digital assistant (PDA), a portable multimedia player (PMP), and a navigation device. However, types of the optical device are not limited thereto, and any device for capturing an image or a picture may be included in the optical device.

The optical device may include a main body 1250. The main body 1250 may be in the form of a bar. Alternatively, the main body 1250 may have various structures such as a slide type, a folder type, a swing type, a swivel type, and the like in which two or more sub-bodies are coupled to be relatively movable. The main body 1250 may include a case (casing, housing, and cover) forming an external appearance. For example, the main body 1250 may include a front case 1251 and a rear case 1252. Various electronic components of the optical device may be built in a space formed between the front case 1251 and the rear case 1252. A display 2151 may be disposed on one surface of the main body 1250. A camera 1121 may be disposed on any one or more surfaces of one surface of the main body 1250 and the other surface disposed on the opposite side of the one surface.

The optical device may include a wireless communication unit 1110. The wireless communication unit 1110 may include one or more modules that enable wireless communication between the optical device and a wireless communication system or between the optical device and a network in which the optical device is positioned. For example, the wireless communication unit 1110 may include any one or more of a broadcast receiving module 1111, a mobile communication module 1112, a wireless internet module 1113, a short-range communication module 1114, and a position information module 1115.

The optical device may include an A/V input unit 1120. The A/V input unit 1120 is for inputting an audio signal or a video signal and may include any one or more of a camera 1121 and a microphone 1122. In this case, the camera 1121 may include a camera device according to the first or embodiment described above.

The optical device may include a sensing unit 1140. The sensing unit 1140 may sense a current state of the optical device such as an opening/closing state of the optical device, a position of the optical device, a presence of a user contact, orientation of the optical device, acceleration/deceleration of the optical device, and the like to generate a sensing signal for controlling an operation of the optical device. For example, when the optical device is in the form of a slide phone, whether the slide phone is opened or closed may be sensed. In addition, it may be responsible for sensing functions related to whether a power supply unit 1190 supplies power or whether an interface unit 1170 is coupled to an external device.

The optical device may include an input/output unit 1150. The input/output unit 1150 may be a configuration for generating an input or output related to vision, hearing, or tactile sense. The input/output unit 1150 may generate input data for controlling an operation of the optical device, and may output information processed by the optical device.

The input/output unit 1150 may include at least one of a keypad portion 1130, a display 1151, a sound output module 1152, and a touch screen panel 1153. The keypad portion 1130 may generate input data by using a keypad input. The display 1151 may output an image captured by the camera 1121. The display 1151 may include a plurality of pixels whose color changes according to an electrical signal. For example, the display 1151 may include at least one of a liquid crystal display (LCD), a thin film transistor-liquid crystal display (TFT LCD), an organic light-emitting diode (OLED), a flexible display, and a three-dimensional (3D) display. The sound output module 1152 may output audio data received from the wireless communication unit 1110 in a call signal reception, a call mode, a recording mode, a voice recognition mode, or a broadcast reception mode, or output audio data stored in a memory unit 1160. The touch screen panel 1153 may convert a change in capacitance generated due to a user's touch on a specific region of a touch screen into an electrical input signal.

The optical device may include the memory unit 1160. The memory unit 1160 may store a program for processing and controlling a controller 1180. In addition, the memory unit 1160 may store input/output data, for example, any one or more of a phone book, a message, audio, a still image, a photo, and a video. The memory unit 1160 may store an image captured by the camera 1121, for example, a picture or a video.

The optical device may include the interface unit 1170. The interface unit 1170 serves as a path for connecting with an external device connected to the optical device. The interface unit 1170 may receive data from an external device, receive power to transfer to each element inside the optical device, or transmit data within the optical device to an external device. The interface unit 1170 may include any one or more of a wired/wireless headset port, an external charger port, a wired/wireless data port, a memory card port, a port connecting a device equipped with an identification module, and audio input/output (I/O) port, a video input/output (I/O) port, and an earphone port.

The optical device may include the controller 1180. The controller 1180 may control an overall operation of the optical device. The controller 1180 may perform related control and processing for voice call, data communication, video call, and the like. The controller 1180 may include a multimedia module 1181 for playing multimedia. The multimedia module 1181 may be provided in the controller 1180, or may be provided separately from the controller 1180. The controller 1180 may perform a pattern recognition processing for recognizing a writing input or a drawing input performed on a touch screen as text and an image, respectively.

The optical device may include the power supply unit 1190. The power supply unit 1190 may receive an external power source or an internal power source by a control of the controller 1180 to supply the power necessary for operating each element.

According to the embodiment, the image sensor is moved relative to the lens barrel in the X-axis, Y-axis, and Z-axis directions instead of moving the conventional lens barrel in order to realize OIS and AF functions of the camera module. Accordingly, the camera module according to the embodiment may remove a complicated spring structure for realizing the OIS and AF functions, thereby simplifying a structure. In addition, it is possible to form a stable structure compared to the related art by moving the image sensor according to the embodiment relative to the lens barrel.

In addition, the circuit board for an image sensor electrically connected to the image sensor according to the embodiment includes a pattern portion having a spring structure and floating in a position that does not overlap with the insulating layer in a vertical direction. In this case, the pattern portion has strength and tensile strength above a certain level. That is, the pattern portion of the embodiment should have elasticity for implementing the OIS and AF functions as well as the electrical signal transmission function. Accordingly, the pattern portion in the embodiment may be formed of a rolled material to have strength and tensile strength above a certain level. According to this, the pattern portion according to the embodiment may solve reliability problems such as pattern breakage occurring during OIS or AF functions. In detail, the circuit board for the image sensor according to the embodiment may stably move the image sensor with respect to the lens barrel while stably elastically supporting the image sensor, thereby improving operational reliability for OIS and AF.

In addition, the metal layer in the embodiment is a rolled material, and thus has a centerline average roughness (Ra) in a range of 0.025 μm to 0.035 μm or/and a 10-point average roughness in a range of 0.3 μm to 0.5 μm. In this case, when the metal layer has a roughness within the above range, the adhesion between the pattern portion and the insulating layer is reduced due to a small surface roughness, and thus the pattern portion is detached from the insulating layer.

Accordingly, the surface of the metal layer in the embodiment is surface-treated to have a surface roughness of a certain level or higher. The surface of the metal layer may be a lower surface in contact with or facing the insulating layer. In this case, the surface treatment of the lower surface in one embodiment may be performed by forming a plating layer on the lower surface of the metal layer. Also, the surface treatment in another embodiment may be performed by applying at least one of chemical polishing and physical polishing to the lower surface of the metal layer. In addition, the lower surface of the metal layer may have a centerline average roughness (Ra) in a range of 0.05 μm to 0.5 μm or/and a 10-point average roughness in a range of 1.0 μm to 5.0 μm by the surface treatment as described above. Accordingly, in the embodiment, a surface roughness of a certain level or higher may be imparted to the lower surface of the metal layer by surface treatment of the lower surface of the metal layer, and thus adhesion with the insulating layer may be improved. In addition, the embodiment may solve the reliability problem in which the pattern portion is detached from the insulating layer by improving the adhesion between the insulating layer and the pattern portion.

In addition, the upper surface of the metal layer in an embodiment is surface-treated to have a surface roughness of a certain level or higher. The upper surface of the metal layer may be a surface in contact with a photo resist (PR) during the formation of the pattern portion. In this case, the surface treatment may be performed by forming a plating layer on the upper surface of the metal layer in the same manner as the lower surface. Also, the surface treatment in another embodiment may be performed by performing soft etching or chemical coating on the upper surface of the metal layer. Accordingly, the upper surface of the metal layer may have a centerline average roughness (Ra) in the range of 0.05 μm to 0.5 μm or/and a 10-point average roughness in the range of 1.0 μm to 5.0 μm by the surface treatment as described above. Accordingly, in the embodiment, a surface roughness of a certain level or higher may be imparted to the upper surface of the metal layer by surface treatment of the upper surface of the metal layer, and thus adhesion with the PR may be improved. In addition, the embodiment may implement a high etching factor by improving the adhesion between the metal layer and the PR, thereby improving reliability. In detail, in the embodiment, as a high etching factor can be implemented, the width of the upper surface of the pattern portion may satisfy the range of 50% to 100% of the width of the lower surface of the pattern portion. Further, according to the embodiment, the noise characteristic of the signal transmitted through the pattern portion may be improved by improving the dimensional deviation of the width of the upper surface and the lower surface of the pattern portion.

According to the above-described embodiment, an X-axis direction shift, a Y-axis direction shift, and a Z-axis-centered rotation corresponding to camera shake with respect to the image sensor may be performed, and accordingly, the camera shake correction for the image sensor may be performed together with the camera shake correction for the corresponding lens, thereby providing a more improved image stabilization function.

In addition, it is possible to reduce a total height of the camera device according to the embodiment by embedding electrical elements required for a camera circuit by utilizing an internal space of the second actuator for moving the image sensor relative to the lens barrel.

In addition, a camera assembly process according to the embodiment may be simplified by integrating and fusing components of the camera circuit and components of the second actuator.

Although the embodiments of the present invention have been described with reference to the accompanying drawings, those skilled in the art to which the present invention pertains will be understood that the present invention may be implemented in other specific forms without modifying the technical spirit and essential features of the present invention. Therefore, it should be understood that the embodiments described above are illustrative in all aspects and not restrictive.

What is claimed is:

1. A circuit board comprising:
an insulating layer; and
a lead pattern part disposed on the insulating layer;
wherein the lead pattern part has a centerline average roughness in a range of 0.05 μm to 0.5 μm or a 10-point average roughness in a range of 1.0 μm to 5.0 μm.

2. The circuit board of claim 1, wherein the lead pattern part includes a contact surface contact surface in contact with the insulating layer and a non-contact surface that does not contact the insulating layer, and wherein the center line average roughness or the 10-point average roughness is a surface roughness of the contact surface or the non-contact surface of the lead pattern part.

3. The circuit board of claim 2, wherein the center line average roughness or the 10-point average roughness is a surface roughness of each of the contact surface and the non-contact surface of the lead pattern part.

4. The circuit board of claim 2, wherein the lead pattern part includes a metal layer disposed on the insulating layer,
  wherein the non-contact surface of the lead pattern part is an upper surface of the metal layer, and
  wherein the contact surface of the lead pattern part is a lower surface of the metal layer.

5. The circuit board of claim 2, wherein the lead pattern part includes:
  a first plating layer disposed on the insulating layer; and
  a metal layer disposed on the first plating layer,
  wherein the non-contact surface of the lead pattern part is an upper surface of the metal layer, and
  wherein the contact surface of the lead pattern part is a lower surface of the first plating layer.

6. The circuit board of claim 2, wherein the lead pattern part includes:
  a first plating layer disposed on the insulating layer;
  a metal layer disposed on the first plating layer; and
  a second plating layer disposed on the metal layer,
  wherein the non-contact surface of the lead pattern part is an upper surface of the second plating layer, and
  wherein a lower surface of the lead pattern part is a lower surface of the first plating layer.

7. The circuit board of claim 2, wherein each of the contact and non-contact surfaces of the lead pattern part has a centerline average roughness in a range of 0.08 μm to 0.15 μm or a 10-point average roughness in a range of 1.0 to 2.5 μm.

8. The circuit board of claim 7, wherein the lead pattern part has an upper width in a range of 50% to 100% of a lower width.

9. The circuit board of claim 1, wherein the lead pattern part includes:
  a first portion disposed on the insulating layer and over-lapping the insulating layer in a vertical direction; and
  a second portion extending from the first portion toward an outer region of the insulating layer.

10. The circuit board of claim 9, wherein the lead pattern part includes:
  a third portion connected to the first portion through the second portion and including a through hole.

11. The circuit board of claim 10, wherein the second portion of the lead pattern part is provided between the first portion and the third portion of the lead pattern part and includes a plurality of bent regions bent in different directions.

12. The circuit board of claim 10, wherein the insulating layer includes an opening passing through the insulating layer, and
  wherein the lead pattern part further includes a fourth portion extending in an inner direction of the insulating layer from the other end of the first portion of the lead pattern part.

13. The circuit board of claim 1, wherein the lead pattern part has a tensile strength of at least 1000 N/mm$^2$ or a 0.2% offset yield strength of at least 1000 N/mm$^2$.

14. The circuit board of claim 1, wherein the lead pattern part includes a binary alloy a ternary composite alloy in which copper (Cu) contains at least one of nickel (Ni), tin (Sn), manganese (Mn), aluminum (Al), beryllium (Be), and cobalt (Co).

15. The circuit board of claim 1, further comprising a reinforcing pattern part disposed on the insulating layer and spaced apart from the lead pattern part,
  wherein the reinforcing pattern part includes the same metal material as the metal material of the lead pattern part.

16. The circuit board of claim 15, wherein the reinforcing pattern part has a centerline average roughness in a range of 0.05 μm to 0.5 μm or a 10-point average roughness in a range of 1.0 μm to 5.0 μm.

17. A sensor driving device comprising:
  a fixed part;
  a moving part spaced apart from the fixed part at a predetermined interval and including a sensor; and
  a plurality of wires disposed between the moving part and the fixed part,
  wherein the moving part includes a circuit board electrically connecting the sensor and the wire, and
  wherein the circuit board includes a first lead pattern part having a centerline average roughness in a range of 0.05 μm to 0.5 μm or a 10-point average roughness in a range of 1.0 μm to 5.0 μm.

18. The sensor driving device of claim 17, wherein the fixed part includes a second lead pattern part,
  wherein one end of the second lead pattern part is electrically connected to the wire, and the other end of the lead pattern part is electrically connected to the image sensor, and
  wherein the wire electrically connects the first lead pattern part and the second lead pattern part.

19. The sensor driving device of claim 17, wherein the circuit board further includes an insulating layer disposed on the first lead pattern part,
  wherein the first lead pattern part includes a contact surface contact surface in contact with the insulating layer and a non-contact surface that does not contact the insulating layer, and
  wherein the center line average roughness or the 10-point average roughness is a surface roughness of the contact surface or the non-contact surface of the lead pattern part.

20. The sensor driving device of claim 19, wherein the insulating layer includes an opening in which the sensor is disposed, and
  wherein the first lead pattern part includes:
  a first portion disposed on the insulating layer;
  a second portion extending outwardly from one end of the first portion;
  a third portion connected to the first portion through the second portion and including a through hole through which the wire passes; and
  a fourth portion extending inwardly from the other end of the first portion, positioned on the opening, and electrically connected to the image sensor.

* * * * *